United States Patent
Lee et al.

(10) Patent No.: US 12,243,877 B2
(45) Date of Patent: *Mar. 4, 2025

(54) DISPLAY DEVICE WITH IMPROVED ALIGNMENT OF LIGHT EMITTING ELEMENTS, AND METHOD OF FABRICATING THE SAME

(71) Applicant: Samsung Display Co., LTD., Yongin-si (KR)

(72) Inventors: Se Hyun Lee, Yongin-si (KR); Dong Woo Kim, Yongin-si (KR); Min Gyeong Shin, Yongin-si (KR); Hak Sun Chang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 468 days.

This patent is subject to a terminal disclaimer.

(21) Appl. No.: 17/578,210

(22) Filed: Jan. 18, 2022

(65) Prior Publication Data

US 2022/0392922 A1    Dec. 8, 2022

(30) Foreign Application Priority Data

Jun. 3, 2021  (KR) ................... 10-2021-0072361

(51) Int. Cl.
*H01L 27/12*     (2006.01)
*H01L 23/00*     (2006.01)
*H01L 25/16*     (2023.01)

(52) U.S. Cl.
CPC ............ *H01L 27/124* (2013.01); *H01L 24/95* (2013.01); *H01L 25/167* (2013.01); *H01L 24/24* (2013.01);
(Continued)

(58) Field of Classification Search
CPC ................. H01L 27/124; H01L 25/167; H01L 2224/95145; H01L 33/005; H01L 33/50; H01L 33/486

See application file for complete search history.

(56) References Cited

U.S. PATENT DOCUMENTS 8,872,214 B2    10/2014  Negishi et al.
10,026,777 B2 *  7/2018  Kang ...................... H01L 27/15
(Continued)

FOREIGN PATENT DOCUMENTS

JP    2008-260073 A    10/2008
JP    2011-086758 A     4/2011
(Continued)

OTHER PUBLICATIONS

WO 2020149475 A1 Jul. 2020.*
(Continued)

*Primary Examiner* — Khiem D Nguyen
(74) *Attorney, Agent, or Firm* — Womble Bond Dickinson (US) LLP

(57) ABSTRACT

A display device and a method of fabricating a display device are provided. A display device includes: a first electrode and a second electrode on a substrate and spaced apart from each other; a third electrode on the substrate; and a first light emitting element between the first electrode and the second electrode. The first electrode, the second electrode, and the third electrode may be arranged on a same layer. The third electrode may be electrically separated from the first electrode and the second electrode.

14 Claims, 16 Drawing Sheets

(52) U.S. Cl.
CPC ..... *H01L 24/82* (2013.01); *H01L 2224/24011* (2013.01); *H01L 2224/24051* (2013.01); *H01L 2224/24145* (2013.01); *H01L 2224/82106* (2013.01); *H01L 2224/95102* (2013.01); *H01L 2224/95145* (2013.01)

(56) References Cited

U.S. PATENT DOCUMENTS

| | | | |
|---|---|---|---|
| 10,461,123 | B2 | 10/2019 | Kim et al. |
| 10,818,647 | B2 | 10/2020 | Kim et al. |
| 11,271,032 | B2 | 3/2022 | Lee et al. |
| 11,967,607 | B2 * | 4/2024 | Do ................. H01L 33/44 |
| 2008/0251381 | A1 * | 10/2008 | Shibata ............ C25D 13/02 |
| | | | 204/483 |
| 2011/0058126 | A1 * | 3/2011 | Okada .............. H10K 19/10 |
| | | | 257/E29.112 |
| 2011/0089850 | A1 | 4/2011 | Shibata et al. |
| 2013/0027623 | A1 | 1/2013 | Negishi et al. |
| 2018/0012876 | A1 * | 1/2018 | Kim ................. H01L 33/387 |
| 2021/0288220 | A1 | 9/2021 | Oh et al. |
| 2022/0077228 | A1 | 3/2022 | Do et al. |
| 2022/0077356 | A1 | 3/2022 | Do et al. |
| 2022/0085247 | A1 | 3/2022 | Do et al. |
| 2022/0085249 | A1 | 3/2022 | Do et al. |
| 2022/0123026 | A1 | 4/2022 | Oh et al. |

FOREIGN PATENT DOCUMENTS

| | | |
|---|---|---|
| JP | 2011-086865 A | 4/2011 |
| KR | 10-0955319 B1 | 4/2010 |
| KR | 10-2018-0007025 A | 1/2018 |
| KR | 10-2018-0071465 A | 6/2018 |
| KR | 10-2018-0072909 A | 7/2018 |
| KR | 10-2020-0010701 | 1/2020 |
| KR | 10-2020-0088954 | 7/2020 |
| KR | 10-2020-0088959 A | 7/2020 |
| KR | 10-2020-0088960 A | 7/2020 |
| KR | 10-2020-0088961 A | 7/2020 |
| KR | 10-2020-0088962 | 7/2020 |
| KR | 10-2020-0144189 | 12/2020 |
| KR | 10-2020-0146014 | 12/2020 |

OTHER PUBLICATIONS

International Search Report issued Apr. 28, 2022 in corresponding International Application No. PCT/KR2022/001156 filed on Jan. 21, 2022, 3 pages.

* cited by examiner

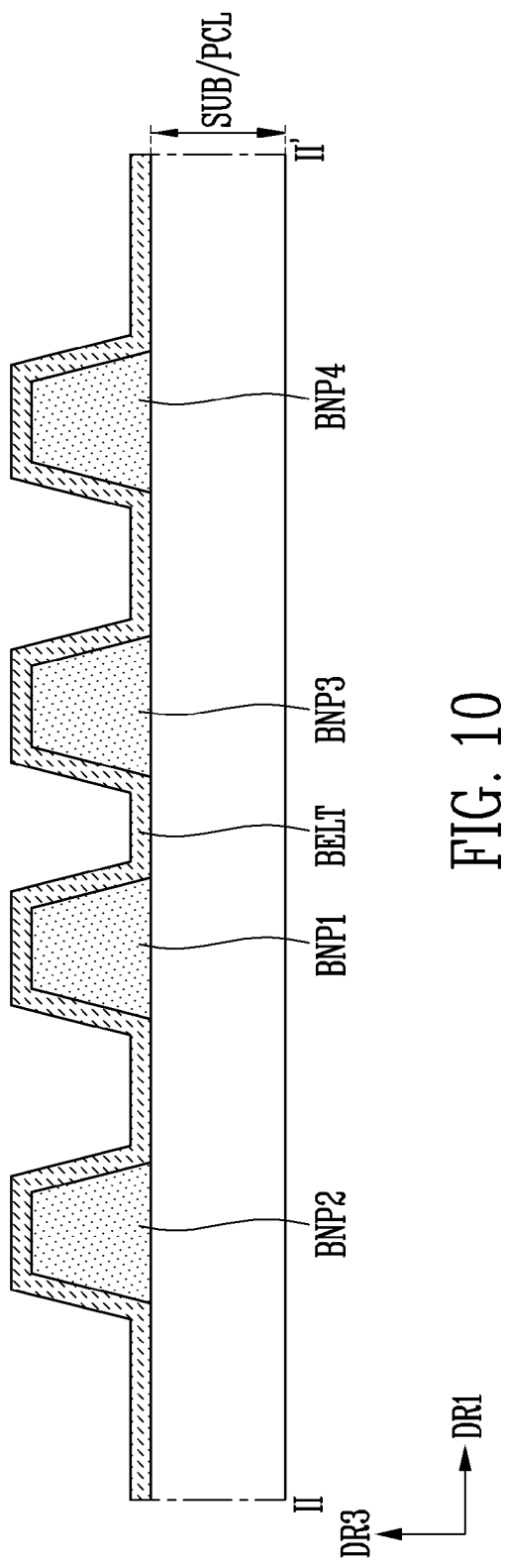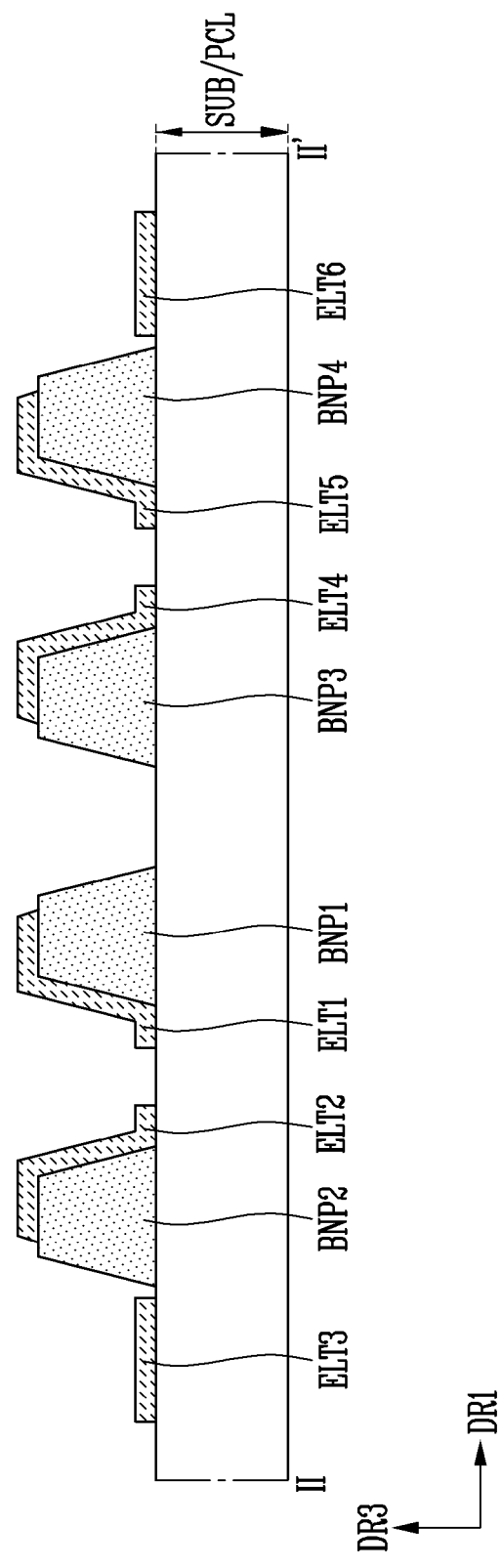

DISPLAY DEVICE WITH IMPROVED ALIGNMENT OF LIGHT EMITTING ELEMENTS, AND METHOD OF FABRICATING THE SAME

CROSS-REFERENCE TO RELATED APPLICATION

This application claims priority to and the benefit of Korean Patent Application Number 10-2021-0072361, filed on Jun. 3, 2021 in the Korean Intellectual Property Office, the entire disclosure of which is incorporated herein by reference.

BACKGROUND

1. Field

Aspects of embodiments of the present disclosure relate to a display device and a method of fabricating a display device.

2. Description of Related Art

Recently, as interest in information display increases, research and development on display devices have been continuously conducted.

SUMMARY

Various embodiments of the present disclosure are directed to a display device and a method of fabricating a display device in which alignment of light emitting elements is excellent, and a light leakage phenomenon is mitigated.

However, the present disclosure is not limited to the above-described aspects and objects, and other aspects and objects that are not mentioned will be understood by those skilled in the art from the following description.

According to one or more embodiments of the present disclosure, a display device includes: a first electrode and a second electrode on a substrate and spaced apart from each other; a third electrode on the substrate; and a first light emitting element between the first electrode and the second electrode. The first electrode, the second electrode, and the third electrode may be arranged on a same layer. The third electrode may be electrically separated from the first electrode and the second electrode.

In accordance with an embodiment, in a plan view, the third electrode may overlap neither the first electrode nor the second electrode.

In accordance with an embodiment, the first electrode and the second electrode may be spaced apart from each other in a first direction. The third electrode may be spaced apart from the first electrode and the second electrode in the first direction, and extend in a second direction intersecting the first direction.

In accordance with an embodiment, the first electrode, the second electrode, and the third electrode may include a same (e.g., an identical) material.

In accordance with an embodiment, the third electrode may include a reflective material, such that light provided to the third electrode is reflected in a display direction of the display device.

In accordance with an embodiment, the display device may further include: a first contact electrode electrically connecting the first electrode with the first light emitting element; and a second contact electrode electrically connecting the second electrode with the first light emitting element. The first contact electrode and the second contact electrode may be electrically separated from the third electrode.

In accordance with an embodiment, the display device may further include: a fourth electrode and a fifth electrode on the substrate and spaced apart from each other; a second light emitting element between the fourth electrode and the fifth electrode; and a sixth electrode on the substrate and overlapping neither the fourth electrode nor the fifth electrode in a plan view.

In accordance with an embodiment, the first electrode, the second electrode, the third electrode, the fourth electrode, the fifth electrode, and the sixth electrode may include a same (e.g., an identical) material.

In accordance with an embodiment, the display device may further include: a third contact electrode electrically connecting the fourth electrode with the second light emitting element; and a fourth contact electrode electrically connecting the fifth electrode with the second light emitting element. The third contact electrode and the fourth contact electrode may be electrically separated from the sixth electrode.

In accordance with an embodiment, the third electrode may be a floating line.

In accordance with an embodiment, the display device may further include a bank on the substrate, and protruding in a display direction of the display device. The third electrode may be between the second electrode and the bank.

In accordance with an embodiment, the third electrode may overlap the bank in a plan view.

In accordance with an embodiment, the display device may further include a light control part configured to change a wavelength of light provided from the first light emitting element.

According to one or more embodiments of the present disclosure, a display device includes: a first electrode and a second electrode on a substrate and spaced apart from each other; a third electrode on the substrate; a light emitting element between the first electrode and the second electrode; a first contact electrode electrically connecting the first electrode with the light emitting element; and a second contact electrode electrically connecting the second electrode with the light emitting element. The first electrode, the second electrode, and the third electrode may be arranged on a same layer. In a plan view, the third electrode may overlap neither the first electrode nor the second electrode. The second contact electrode may be electrically connected with the third electrode.

In accordance with an embodiment, the light emitting element may be supplied with a cathode signal through the second electrode and the second contact electrode.

According to one or more embodiments of the present disclosure, a method of fabricating a display device includes: forming a base electrode on a substrate; removing at least a portion of the base electrode to provide a first electrode, a second electrode, and a third electrode that are spaced apart from each other; providing, on the substrate, an ink including a light emitting element and a solvent provided with the light emitting element; and aligning the light emitting element between the first electrode and the second electrode by forming an electric field between the first electrode and the second electrode. In the aligning the light emitting element, the third electrode may be electrically separated from the first electrode and the second electrode, such that an electrical signal to form the electric field may not be provided to the third electrode.

In accordance with an embodiment, the method may further include forming a first contact electrode configured to electrically connect the first electrode with the light emitting element, and a second contact electrode configured to electrically connect the second electrode with the light emitting element.

In accordance with an embodiment, in a plan view, the third electrode may overlap neither the first electrode nor the second electrode.

In accordance with an embodiment, the method may further include forming a bank on the substrate such that the bank overlaps the third electrode in a plan view.

In accordance with an embodiment, the aligning the light emitting element may include providing a first electrical signal to the first electrode, and providing a second electrical signal to the second electrode. The first electrical signal and the second electrical signal may not be provided to the third electrode.

However, aspects and technical solutions of the present disclosure may not be limited to the above, and other aspects and technical solutions of the present disclosure will be understandable to those having ordinary skill in the art from the disclosures provided below together with the accompanying drawings.

BRIEF DESCRIPTION OF THE DRAWINGS

FIGS. 9 to 18 are views illustrating, by process steps, a method of fabricating a display device in accordance with an embodiment.

DETAILED DESCRIPTION

Figure 1:
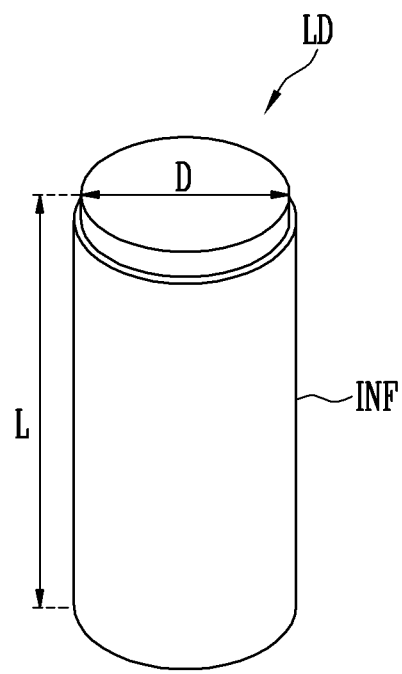
FIGS. 1 and 2 are a perspective view and a cross-sectional view, respectively, illustrating a light emitting element in accordance with an embodiment of the present disclosure.

Description of embodiments in this specification are provided to clearly explain the scope of the present disclosure to those having ordinary skill in the art, and are not intended to limit the present disclosure. It is to be understood that the present disclosure may include substitutions and modifications within the technical scope of the present disclosure.

The terms used in this specification are selected from general terms, which are widely used currently, based on functions of components according to the embodiment of the present disclosure, and may have meanings varying according to the intentions of those skilled in the art, the custom in the field of art, or advent of new technology. If a specific term is used with a specific meaning, the meaning of the term will be described specifically. Accordingly, the terms used in this specification should not be defined as simple names of the components, but be defined based on the actual meaning of the terms and the whole context throughout the present specification.

The accompanying drawings are provided to facilitate the explanation of the present disclosure, and shapes or sizes in the drawings may be exaggerated for the purpose of convenience of explanation, such that the present disclosure should not be limited to the drawings.

If in the specification, descriptions of well-known functions or configurations would unnecessarily obfuscate the gist of the present disclosure, the descriptions may be omitted.

It is to be understood that when an element or a layer is referred to as being "on" or "above" another element or layer, it may be directly on or above another element or layer or one or more intervening elements or layers may be present. Like reference numerals refer to like elements throughout the specification.

It is to be understood that, although terms such as "first," "second," and the like may be used herein to describe various components, these components are not limited by these terms. These terms are used to distinguish one element or component from another element or component. Therefore, a first component described below could be termed a second component without departing from the scope and spirit of the present disclosure.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Various embodiments of the present disclosure relate to a display device and a method of fabricating the same.

Herein, a display device and a method of fabricating a display device in accordance with one or more embodiments will be described with reference to the attached drawings.

Figure 2:
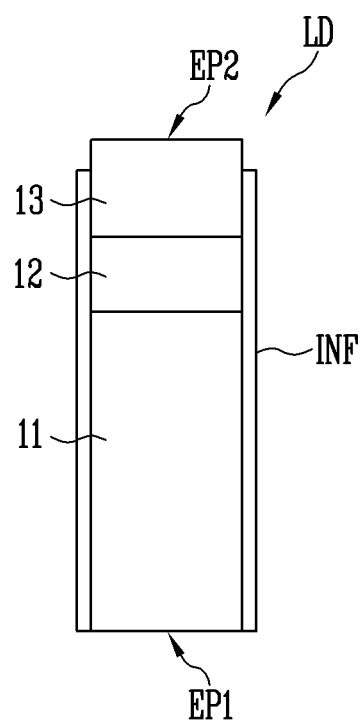

FIGS. 1 and 2 illustrate a light emitting element LD included in a display device (e.g., a display device DD of FIG. 3) in accordance with an embodiment. FIGS. 1 and 2 are a perspective view and a cross-sectional view, respectively, illustrating a light emitting element in accordance with an embodiment of the present disclosure.

Referring to FIGS. 1 and 2, the light emitting element LD may include a first semiconductor layer 11, a second semiconductor layer 13, and an active layer 12 interposed between the first and second semiconductor layers 11 and 13. For example, the first semiconductor layer 11, the active layer 12, and the second semiconductor layer 13 may be successively stacked in a longitudinal direction of the light emitting element LD.

The light emitting element LD may include a first end EP1 and a second end EP2. The first semiconductor layer 11 may be adjacent to the first end EP1 of the light emitting element LD. The second semiconductor layer 13 may be adjacent to the second end EP2 of the light emitting element LD.

In an embodiment, the light emitting element LD may have a pillar shape. The pillar shape may refer to a shape, such as a cylindrical shape or a prismatic shape, which extends in the longitudinal direction. In other words, a length L of the light emitting element LD may be greater than a diameter D thereof (or a width of a cross-section thereof). A shape of the light emitting element LD may include a rod-like shape or a bar-like shape, but the present disclosure is not limited thereto.

The light emitting element LD may have a size corresponding to a range from the nanometer scale to the micrometer scale. For example, the diameter D (or the width) and the length L of the light emitting element LD each may have a size in a range from the nanometer scale to the micrometer scale, but the present disclosure is not limited thereto.

The first semiconductor layer 11 may be a first conductive semiconductor layer. For example, the first semiconductor layer 11 may include an N-type semiconductor layer. For instance, the first semiconductor layer 11 may include an N-type semiconductor layer which includes any semiconductor material of InAlGaN, GaN, AlGaN, InGaN, AlN, and InN and is doped with a first conductive dopant, such as Si, Ge, or Sn. However, the material constituting the first semiconductor layer 11 is not limited thereto.

The active layer 12 may be disposed on the first semiconductor layer 11 and have a single-quantum well structure or a multi-quantum well structure. The location of the active layer 12 may be changed in various ways depending on the type of the light emitting element LD.

A cladding layer (not shown) doped with a conductive dopant may be formed on and/or under the active layer 12. For example, the cladding layer may be formed of an AlGaN layer or an InAlGaN layer. In an embodiment, a material such as AlGaN or InAlGaN may be used to form the active layer 12, and various other materials may be used to form the active layer 12.

The second semiconductor layer 13 may be disposed on the active layer 12 and include a semiconductor layer having a type different from that of the first semiconductor layer 11. For example, the second semiconductor layer 13 may include a P-type semiconductor layer. For instance, the second semiconductor layer 13 may include a P-type semiconductor layer which includes at least one semiconductor material of InAlGaN, GaN, AlGaN, InGaN, AlN, and InN, and is doped with a second conductive dopant, such as Mg. However, the material for forming the second semiconductor layer 13 is not limited thereto, and the second semiconductor layer 13 may be formed of various other materials.

If a voltage equal to or greater than a threshold voltage is applied between the opposite ends of the light emitting element LD, the light emitting element LD may emit light by coupling of electron-hole pairs in the active layer 12. Since light emission of the light emitting element LD can be controlled based on the foregoing principle, the light emitting element LD may be used as a light source of various light emitting devices as well as a pixel of the display device DD.

The light emitting element LD may further include an insulating film INF provided on a surface of the light emitting element LD. The insulating film INF may be formed of a single film or a double layer structure, but the present disclosure is not limited thereto. The insulating film INF may be formed of a plurality of layers. For example, the insulating film INF may include a first insulating film including a first material, and a second insulating film including a second material different from the first material.

The insulating film INF may allow the opposite ends of the light emitting element LD that have different polarities to be exposed to the outside. For example, the insulating film INF may allow a portion of the first semiconductor layer 11 disposed adjacent to the first end EP1 and a portion of the second semiconductor layer 13 disposed adjacent to the second end EP2 to be exposed to the outside.

The insulating film INF may be formed of a single layer or multiple layers including at least one insulating material among silicon oxide (SiOx), silicon nitride (SiNx), silicon oxynitride (SiOxNy), aluminum oxide (AlOx), and titanium dioxide (TiOx), but the present disclosure is not limited thereto.

The insulating film INF may secure electrical stability of the light emitting element LD. In addition, even in a case in which a plurality of light emitting elements LD are disposed adjacent to each other, an undesired short circuit may be prevented or substantially prevented from occurring between the light emitting elements LD.

In an embodiment, the light emitting element LD may further include additional other components as well as the first semiconductor layer 11, the active layer 12, the second semiconductor layer 13, and the insulating film INF. For example, the light emitting element LD may further include a fluorescent layer, an active layer, a semiconductor layer, and/or an electrode layer. For example, a contact electrode layer may be further disposed on each of the first and second ends EP1 and EP2 of the light emitting element LD.

Figure 3:
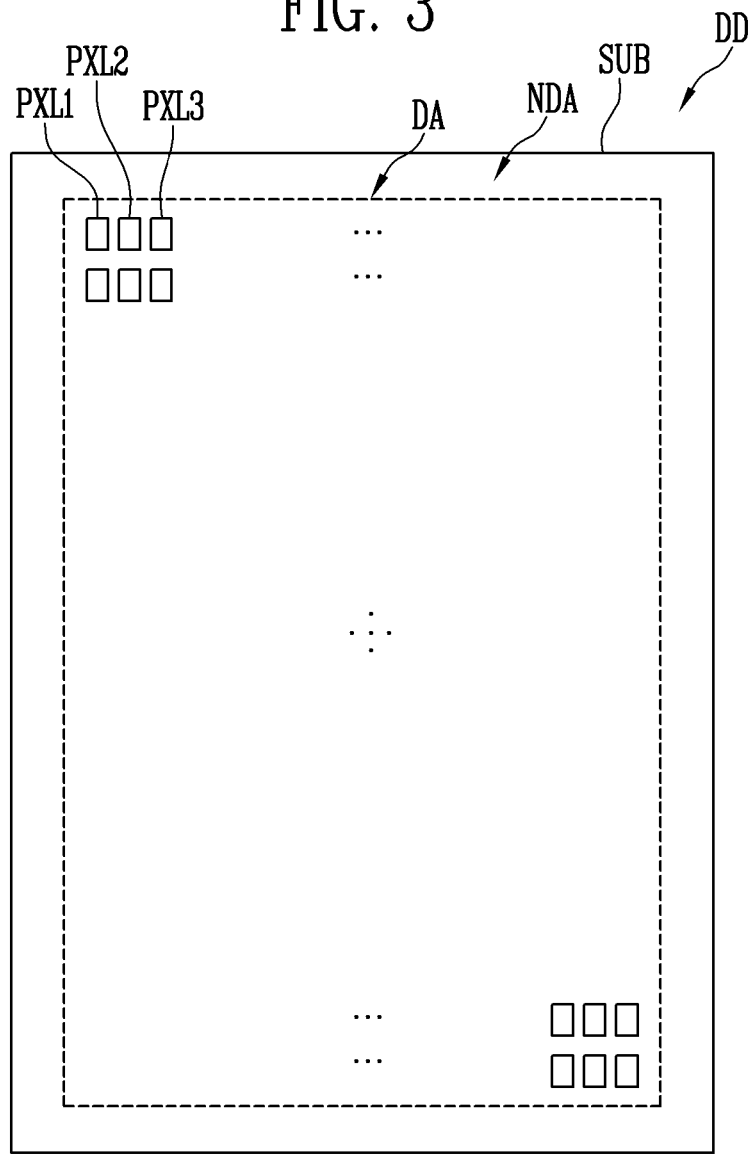
FIG. 3 is a plan view schematically illustrating a display device in accordance with an embodiment.

FIG. 3 is a plan view schematically illustrating the display device DD in accordance with an embodiment.

The display device DD may emit light. Referring to FIG. 3, the display device DD may include a substrate SUB, and pixels PXL disposed on the substrate SUB. Although not illustrated in the drawing, the display device DD may further include a driving circuit layer (e.g., a scan driver and a data driver) configured to drive the pixels PXL, lines, and pads.

The display device DD may include a display area DA and a non-display area NDA. The non-display area NDA may refer to an area other than the display area DA. In an embodiment, the non-display area NDA may enclose at least a portion of the display area DA.

The substrate SUB may form a base of the display device DD. The substrate SUB may be a rigid or flexible substrate or film but is not limited to a specific example.

The display area DA may refer to an area in which the pixels PXL are disposed. The non-display area NDA may refer to an area in which the pixels PXL are not disposed. The driving circuit layer, the lines, and the pads which are connected to the pixels PXL of the display area DA may be disposed in the non-display area NDA.

For example, the pixels PXL may be arranged in a stripe or PENTILE™ arrangement structure or the like, but the present disclosure is not limited thereto. Various known embodiments may be applied to the arrangement structure of the pixels PXL.

In an embodiment, the pixels PXL may include a first pixel PXL1, a second pixel PXL2, and a third pixel PXL3. The first to third pixels PXL1, PXL2, and PXL3 each may be a sub-pixel. At least one first pixel PXL1, at least one second pixel PXL2, and at least one third pixel PXL3 may form one pixel unit which may emit light having various colors.

For example, each of the first to third pixels PXL1, PXL2, and PXL3 may emit a color of light (e.g., a predetermined color of light). For instance, the first pixel PXL1 may be a first color (e.g., red) pixel configured to emit first color (e.g., red) light, the second pixel PXL2 may be a second color (e.g., green) pixel configured to emit second color (e.g., green) light, and the third pixel PXL3 may be a third color (e.g., blue) pixel configured to emit third color (e.g., blue) light. However, the color, type, and/or number of first to third pixels PXL1, PXL2, and PXL3 which form each pixel unit is not limited to a specific example.

Herein, a structure of the pixel PXL in accordance with an embodiment will be described in further detail with reference to FIGS. 4 to 8.

First, the pixel PXL in accordance with an embodiment will be described with reference to FIGS. 4 to 6.

Figure 4:
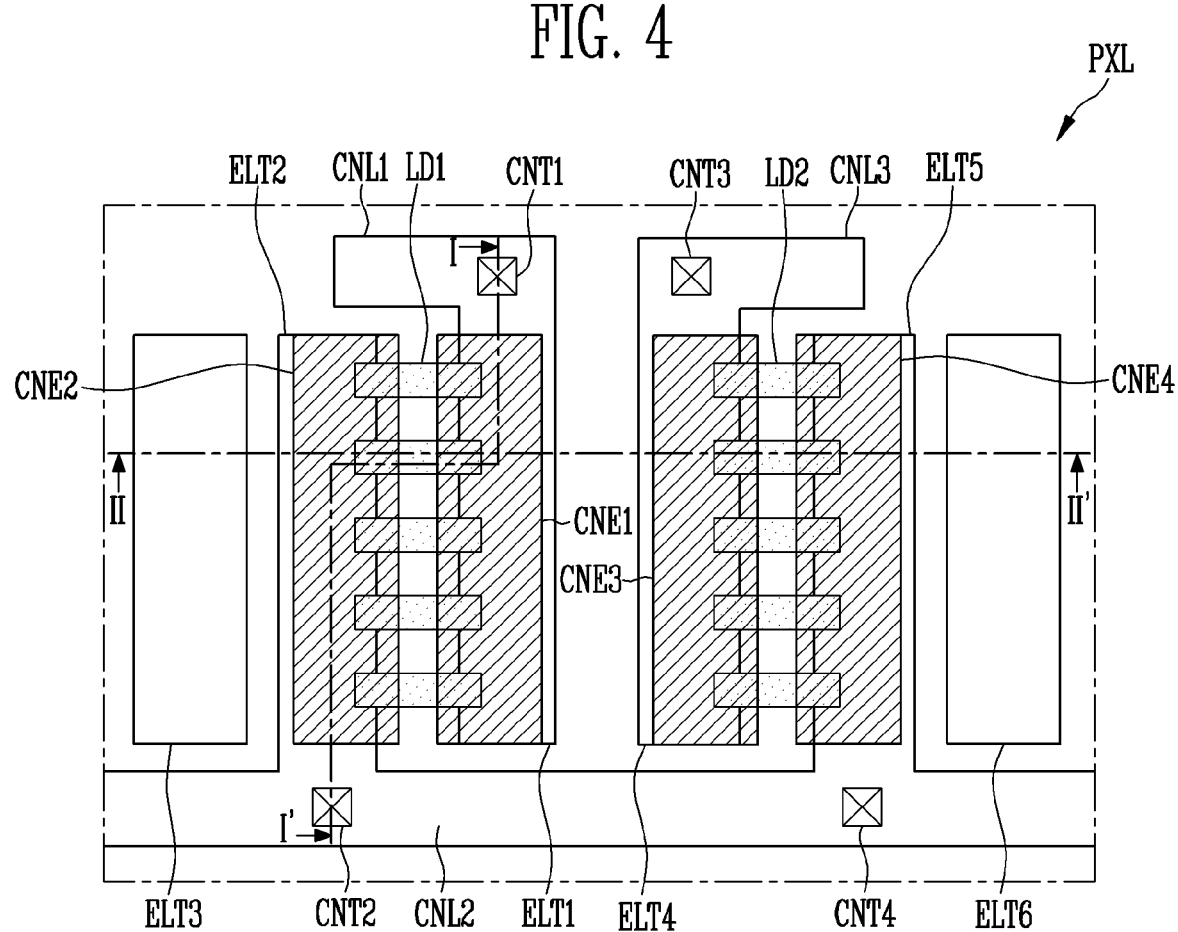
FIG. 4 is a plan view illustrating a pixel in accordance with an embodiment.

FIG. 4 is a plan view illustrating the pixel PXL in accordance with an embodiment. The pixel PXL illustrated in FIG. 4 may be at least any one of the first to third pixels PXL1, PXL2, and PXL3.

Referring to FIG. 4, the pixel PXL may include first to sixth electrodes ELT1 to ELT6, first to fourth contact electrodes CNE1 to CNE4, and a light emitting element LD. In an embodiment, the light emitting element LD may include a first light emitting element LD1 and a second light emitting element LD2.

In an embodiment, a plurality of light emitting elements LD may be provided and arranged in a parallel structure. For example, the light emitting elements LD may be arranged in a second direction DR2. However, the arrangement structure of the light emitting element LD is not limited thereto.

The light emitting element LD may be disposed between electrodes configured to function as alignment electrodes.

In an embodiment, the first light emitting element LD1 may be disposed between the first electrode ELT1 and the second electrode ELT2. The second light emitting element LD2 may be disposed between the fourth electrode ELT4 and the fifth electrode ELT5. The first light emitting element LD1 may be disposed on the first electrode ELT1 and the second electrode ELT2. The second light emitting element LD2 may be disposed on the fourth electrode ELT4 and the fifth electrode ELT5.

The first light emitting element LD1 may be electrically connected to the first electrode ELT1 through the first contact electrode CNE1. The first light emitting element LD1 may be electrically connected to the second electrode ELT2 through the second contact electrode CNE2.

The second light emitting element LD2 may be electrically connected to the fourth electrode ELT4 through the third contact electrode CNE3. The second light emitting element LD2 may be electrically connected to the fifth electrode ELT5 through the fourth contact electrode CNE4.

In an embodiment, the light emitting element LD may be spaced apart from the third electrode ELT3 and the sixth electrode ELT6. The first light emitting element LD1 may be electrically separated from the third electrode ELT3. The second light emitting element LD2 may be electrically separated from the sixth electrode ELT6.

The first contact electrode CNE1 may be disposed on the first electrode ELT1 and electrically connected with the first electrode ELT1.

The second contact electrode CNE2 may be disposed on the second electrode ELT2 and electrically connected with the second electrode ELT2.

The third contact electrode CNE3 may be disposed on the fourth electrode ELT4 and electrically connected with the fourth electrode ELT4.

The fourth contact electrode CNE4 may be disposed on the fifth electrode ELT5 and electrically connected with the fifth electrode ELT5.

The first electrode ELT1 may extend in the second direction DR2. The first electrode ELT1 may be spaced apart from the second electrode ELT2 in a first direction DR1. The first electrode ELT1 may be connected with a first connection line CNL1. Here, the first direction DR1 may intersect (or be not parallel to) the second direction DR2. The first connection line CNL1 may be connected with a bridge pattern (e.g., a bridge pattern BRP of FIG. 5) included in a pixel circuit part (e.g., a pixel circuit part PCL of FIG. 5) through a first contact part CNT1.

The second electrode ELT2 may extend in the second direction DR2. The second electrode ELT2 may be spaced apart from the first electrode ELT1 in the first direction DR1. The second electrode ELT2 may be connected with a second connection line CNL2. The second connection line CNL2 may be connected with a power line PL included in the pixel circuit part PCL through a second contact part CNT2.

The third electrode ELT3 may extend in the second direction DR2. The third electrode ELT3 may be spaced apart from the first electrode ELT1 and the second electrode ELT2 in the first direction DR1. In a plan view, the third electrode ELT3 may overlap neither the first electrode ELT1 nor the second electrode ELT2.

The fourth electrode ELT4 may extend in the second direction DR2. The fourth electrode ELT4 may be spaced apart from the sixth electrode ELT6 in the first direction DR1. The fourth electrode ELT4 may be connected with a third connection line CNL3. The third connection line CNL3 may be connected with a line included in the pixel circuit part PCL through a third contact part CNT3.

The fifth electrode ELT5 may extend in the second direction DR2. The fifth electrode ELT5 may be spaced apart from the fourth electrode ELT4 in the first direction DR1. The fifth electrode ELT5 may be connected with the second connection line CNL2. The second connection line CNL2 may be connected with another line included in the pixel circuit part PCL through a fourth contact part CNT4.

The sixth electrode ELT6 may extend in the second direction DR2. The sixth electrode ELT6 may be spaced apart from the fourth electrode ELT4 and the fifth electrode ELT5 in the first direction DR1. In a plan view, the sixth electrode ELT6 may overlap neither the fourth electrode ELT4 nor the fifth electrode ELT5.

In an embodiment, the third electrode ELT3 may be a floating line. The third electrode ELT3 may float with respect to the first electrode ELT1 and the second electrode ELT2. For example, the third electrode ELT3 may be physically spaced apart from the first electrode ELT1 and the second electrode ELT2, and electrically separated therefrom. In a case in which an electrical signal is provided to the first electrode ELT1, the provided electrical signal may not be applied to the third electrode ELT3.

In an embodiment, the sixth electrode ELT6 may be a floating line. The sixth electrode ELT6 may float with respect to the fourth electrode ELT4 and the fifth electrode ELT5. For example, the sixth electrode ELT6 may be physically spaced apart from the fourth electrode ELT4 and the fifth electrode ELT5, and electrically separated therefrom. In a case which an electrical signal is provided to the fifth electrode ELT5, the provided electrical signal may not be applied to the sixth electrode ELT6.

The first light emitting element LD1 may be arranged based on an electrical field between the first electrode ELT1 and the second electrode ELT2. Here, an electrical signal for forming the electric field may be provided to the first electrode ELT1 and the second electrode ELT2, and may not be provided to the third electrode ELT3.

The second light emitting element LD2 may be arranged based on an electrical field between the fourth electrode ELT4 and the fifth electrode ELT5. Here, an electrical signal for forming the electric field may be provided to the fourth electrode ELT4 and the fifth electrode ELT5, and may not be provided to the sixth electrode ELT6.

The pixel PXL in accordance with an embodiment may include the third electrode ELT3 and the sixth electrode ELT6 that are formed of floating lines, such that a light leakage phenomenon may be mitigated, and the alignment of the light emitting elements LD may be improved. For the sake of explanation, technical effects based on the third electrode ELT3 will be described.

In an embodiment, ink (e.g., ink INK of FIG. 13) may be provided on the substrate SUB, and a process of forming an electric field between the first electrode ELT1 and the second electrode ELT2 may be performed.

If the third electrode ELT3 were electrically connected with the first electrode ELT1 and/or the second electrode ELT2, an electrical double layer (EDL) formed on the first electrode ELT1 and the second electrode ELT2 may expand to the third electrode ELT3 when the process of forming the electric field is performed. In this case, an AC electro-osmosis (ACEO) phenomenon may more severely occur, such that the alignment of the light emitting elements LD may be reduced.

However, in an embodiment of the present disclosure, the third electrode ELT3 is electrically separated from the first electrode ELT1 and the second electrode ELT2, such that the phenomenon in which the electrical double layer expands may be prevented or substantially prevented from occurring. As a result, the alignment of the light emitting element LD may be improved.

The third electrode ELT3 and the sixth electrode ELT6 that are formed of floating lines may cover an area where lines are not disposed. Hence, a light leakage phenomenon with respect to light emitted from the light emitting elements LD may be prevented or substantially prevented from occurring.

Herein, a cross-sectional structure of the pixel PXL in accordance with an embodiment will be described with reference to FIGS. 5 to 6.

Figure 5:
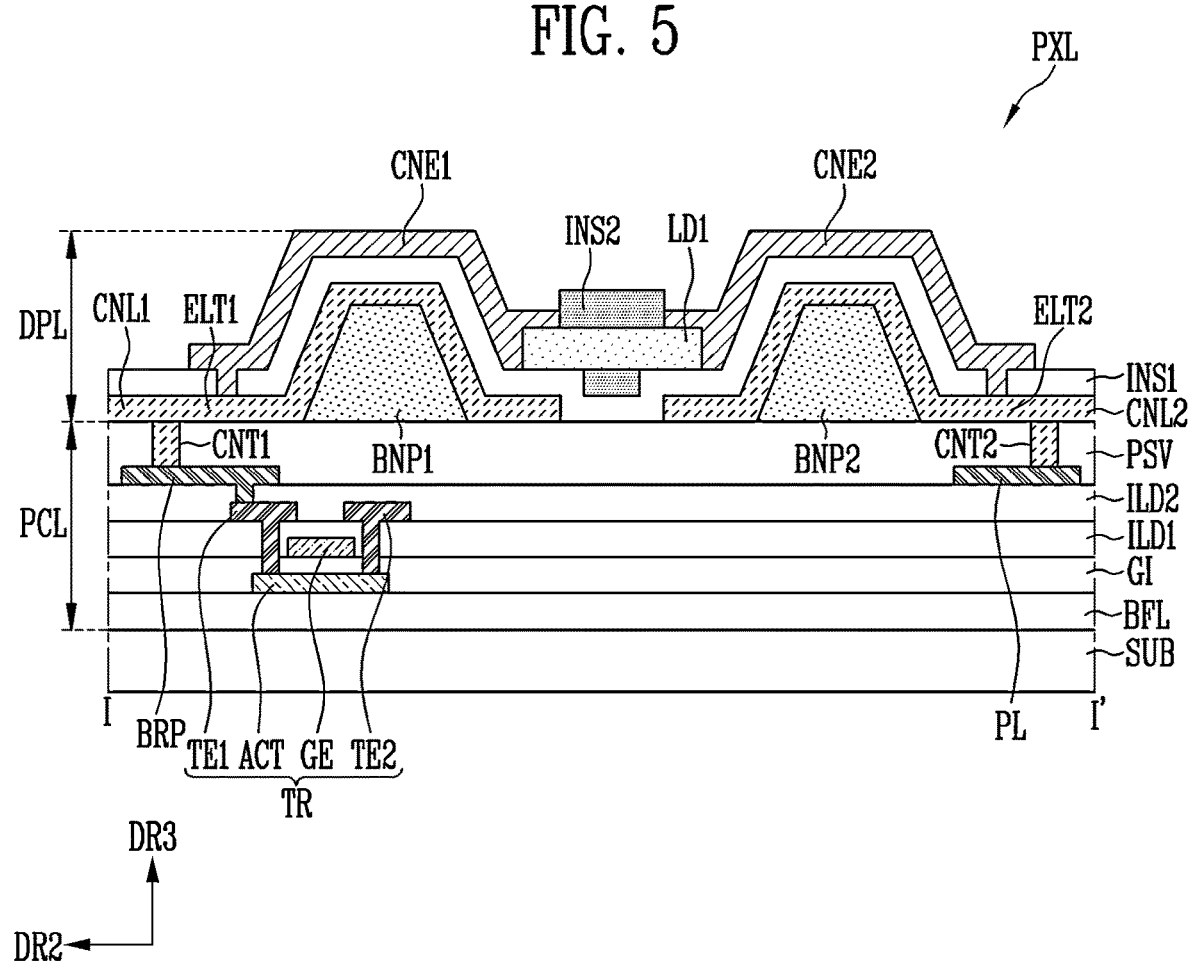
FIG. 5 is a cross-sectional view taken along the line I-I' of FIG. 4.

FIG. 5 is a cross-sectional view taken along the line I-I' of FIG. 4. FIG. 5 mainly illustrates the pixel circuit part PCL and a display element part DPL. FIG. 5 illustrates the first light emitting element LD1 of the light emitting elements LD.

Referring to FIG. 5, the pixel PXL may include the substrate SUB, the pixel circuit part PCL, and the display element part DPL.

The substrate SUB may be provided as a base surface, and the pixel circuit part PCL and the display element part DPL may be disposed on the substrate SUB.

The pixel circuit part PCL may be disposed on the substrate SUB. In an embodiment, the pixel circuit part PCL may include a buffer layer BFL, a transistor TR, a gate insulating layer GI, a first interlayer insulating layer ILD1, a second interlayer insulating layer ILD2, the bridge pattern BRP, the power line PL, a passivation layer PSV, the first contact part CNT1, and the second contact part CNT2.

The buffer layer BFL may be disposed on the substrate SUB. The buffer layer BFL may prevent or substantially prevent impurities from diffusing from the outside. The buffer layer BFL may include at least one of silicon nitride (SiNx), silicon oxide (SiOx), silicon oxynitride (SiOxNy), and metal oxide, such as aluminum oxide (AlOx).

The transistor TR may be a thin film transistor. In an embodiment, the transistor TR may be a driving transistor.

The transistor TR may be electrically connected with the light emitting element LD. The transistor TR may be electrically connected with the bridge pattern BRP.

The transistor TR may include an active layer ACT, a first transistor electrode TE1, a second transistor electrode TE2, and a gate electrode GE.

The active layer ACT may refer to a semiconductor layer. The active layer ACT may be disposed on the buffer layer BFL. The active layer ACT may include at least one of polysilicon, amorphous silicon, and an oxide semiconductor.

The active layer ACT may include a first contact area which contacts the first transistor electrode TE1, and a second contact area which contacts the second transistor electrode TE2. Each of the first contact area and the second contact area may be a semiconductor pattern doped with impurities. An area between the first contact area and the second contact area may be a channel area. The channel area may be an intrinsic semiconductor pattern which is not doped with impurities.

The gate electrode GE may be disposed on the gate insulating layer GI. The position of the gate electrode GE may correspond to the position of the channel area of the active layer ACT. For example, the gate electrode GE may be disposed on the channel area of the active layer ACT with the gate insulating layer GI interposed therebetween.

The gate insulating layer GI may be disposed on the active layer ACT. The gate insulating layer GI may include an inorganic material. For example, the gate insulating layer GI may include at least one of silicon nitride (SiNx), silicon oxide (SiOx), silicon oxynitride (SiOxNy), and aluminum oxide (AlOx).

The first interlayer insulating layer ILD1 may be disposed on the gate electrode GE. The first interlayer insulating layer ILD1 may include at least one of silicon nitride (SiNx), silicon oxide (SiOx), silicon oxynitride (SiOxNy), and aluminum oxide (AlOx), in the same manner as that of the gate insulating layer GI.

The first transistor electrode TE1 and the second transistor electrode TE2 may be disposed on the first interlayer insulating layer ILD1. The first transistor electrode TE1 may contact the first contact area of the active layer ACT through the gate insulating layer GI and the first interlayer insulating layer ILD1. The second transistor electrode TE2 may contact the second contact area of the active layer ACT through the gate insulating layer GI and the first interlayer insulating layer ILD1. For example, the first transistor electrode TE1 may be a drain electrode, and the second transistor electrode TE2 may be a source electrode, but the present disclosure is not limited thereto.

The second interlayer insulating layer ILD2 may be disposed on the first transistor electrode TE1 and the second transistor electrode TE2. The second interlayer insulating layer ILD2 may include an inorganic material, in the same manner as that of the first interlayer insulating layer ILD1 and the gate insulating layer GI. The inorganic material may include at least one of materials such as silicon nitride (SiNx), silicon oxide (SiOx), silicon oxynitride (SiOxNy), and aluminum oxide (AlOx), as examples of constituent materials of the first interlayer insulating layer ILD1 and the gate insulating layer GI.

The bridge pattern BRP may be disposed on the second interlayer insulating layer ILD2. The bridge pattern BRP may be electrically connected with the first transistor electrode TE1 through a contact hole passing through the second interlayer insulating layer ILD2. The bridge pattern BRP may be electrically connected with the first connection line CNL1 through the first contact part CNT1 formed in the passivation layer PSV.

The power line PL may be disposed on the second interlayer insulating layer ILD2. The power line PL may be electrically connected with the second connection line CNL2 through the second contact part CNT2 formed in the passivation layer PSV.

The passivation layer PSV may be disposed on the second interlayer insulating layer ILD2. The passivation layer PSV may cover the bridge pattern BRP and the power line PL. The passivation layer PSV may be provided in the form of an organic insulating layer, an inorganic insulating layer, or a structure including an organic insulating layer disposed on an inorganic insulating layer, but the present disclosure is not limited thereto. In an embodiment, the first contact part CNT1 connected with an area of the bridge pattern BRP, and the second contact part CNT2 connected with an area of the power line PL may be formed in the passivation layer PSV.

The display element part DPL may be disposed on the pixel circuit part PCL. The display element part DPL may include a first bank pattern BNP1, a second bank pattern BNP2, the first connection line CNL1, the second connection line CNL2, the first electrode ELT1, the second electrode ELT2, a first insulating layer INS1, the first light emitting element LD1, a second insulating layer INS2, the first contact electrode CNE1, and the second contact electrode CNE2.

The first bank pattern BNP1 and the second bank pattern BNP2 may be disposed on the passivation layer PSV. The first bank pattern BNP1 and the second bank pattern BNP2 each may have a shape protruding in a display direction of the display device DD.

The first connection line CNL1 and the second connection line CNL2 may be disposed on the passivation layer PSV. The first connection line CNL1 may be connected with the first electrode ELT1. The first connection line CNL1 may be electrically connected with the bridge pattern BRP through the first contact part CNT1. The first connection line CNL1 may electrically connect the bridge pattern BRP with the first electrode ELT1. The second connection line CNL2 may be connected with the second electrode ELT2. The second connection line CNL2 may be electrically connected with the power line PL through the second contact part CNT2. The second connection line CNL2 may electrically connect the power line PL with the second electrode ELT2.

The first electrode ELT1 and the second electrode ELT2 may be disposed on the passivation layer PSV. In an embodiment, at least a portion of the first electrode ELT1 may be disposed on the first bank pattern BNP1, and at least a portion of the second electrode ELT2 may be disposed on the second bank pattern BNP2, such that each may function as a reflective partition wall.

The first electrode ELT1 may be electrically connected with the first light emitting element LD1. The first electrode ELT1 may be electrically connected with the first contact electrode CNE1 through a contact hole formed in the first insulating layer INS1. In an embodiment, the first electrode ELT1 may apply an anode signal to the first light emitting element LD1.

The second electrode ELT2 may be electrically connected with the first light emitting element LD1. The second electrode ELT2 may be electrically connected with the second contact electrode CNE2 through a contact hole formed in the first insulating layer INS1. In an embodiment, the second electrode ELT2 may apply a cathode signal (e.g., a ground signal) to the first light emitting element LD1.

The first electrode ELT1 and the second electrode ELT2 may include conductive material. For example, the first electrode EL1 and the second electrode EL2 each may include a metal, such as silver (Ag), magnesium (Mg), aluminum (Al), platinum (Pt), palladium (Pd), gold (Au), nickel (Ni), neodymium (Nd), iridium (Ir), chromium (Cr), titanium (Ti), or an alloy thereof. However, the present disclosure is not limited to the foregoing examples.

The first insulating layer INS1 may be disposed on the passivation layer PSV. The first insulating layer INS1 may cover the first electrode ELT1 and the second electrode ELT2. The first insulating layer INS1 may stabilize connection between electrode components and reduce external influence. In an embodiment, the first insulating layer INS1 may include at least one of silicon nitride (SiNx), silicon oxide (SiOx), silicon oxynitride (SiOxNy), and aluminum oxide (AlOx).

The first light emitting element LD1 may be disposed on the first insulating layer INS1. The light emitting element LD may be the light emitting element LD described above with reference to FIGS. 1 and 2. The first light emitting element LD1 may emit light based on electrical signals provided from the first contact electrode CNE1 and the second contact electrode CNE2.

In an embodiment, a first end of the first light emitting element LD1 may abut on a portion of a groove formed by the first insulating layer INS1, and a second end of the first light emitting element LD1 may abut on another portion of the groove formed by the first insulating layer INS1.

The second insulating layer INS2 may be disposed on the first light emitting element LD1. The second insulating layer INS2 may cover the active layer 12 of the first light emitting element LD1. In an embodiment, the second insulating layer INS2 may include any of an organic material or an inorganic material.

In an embodiment, at least a portion of the second insulating layer INS2 may be disposed on a rear surface of the first light emitting element LD1. In an embodiment, the second insulating layer INS2 may be charged into at least a portion of a groove formed at the rear surface of the first light emitting element LD1.

The first contact electrode CNE1 and the second contact electrode CNE2 may be disposed on the first insulating layer INS1. The first contact electrode CNE1 may electrically connect the first electrode ELT1 with the first light emitting element LD1. The second contact electrode CNE2 may electrically connect the second electrode ELT2 with the first light emitting element LD1.

The first contact electrode CNE1 and the second contact electrode CNE2 may include conductive material. For example, the first contact electrode CNE1 and the second contact electrode CNE2 may include a transparent conductive material including any of indium tin oxide (ITO), indium zinc oxide (IZO), and indium tin zinc oxide (ITZO), but the present disclosure is not limited thereto.

A disposition relationship pertaining to the first light emitting element LD1, the electrode components, etc. is not limited to that of the example described above with reference to FIG. 5. The disposition relationship may be implemented in various ways depending on embodiments. For example, although not illustrated, the display element part DPL may further include a planarization layer and/or an additional insulating layer which is disposed on the first contact electrode CNE1 and the second contact electrode CNE2.

Figure 6:
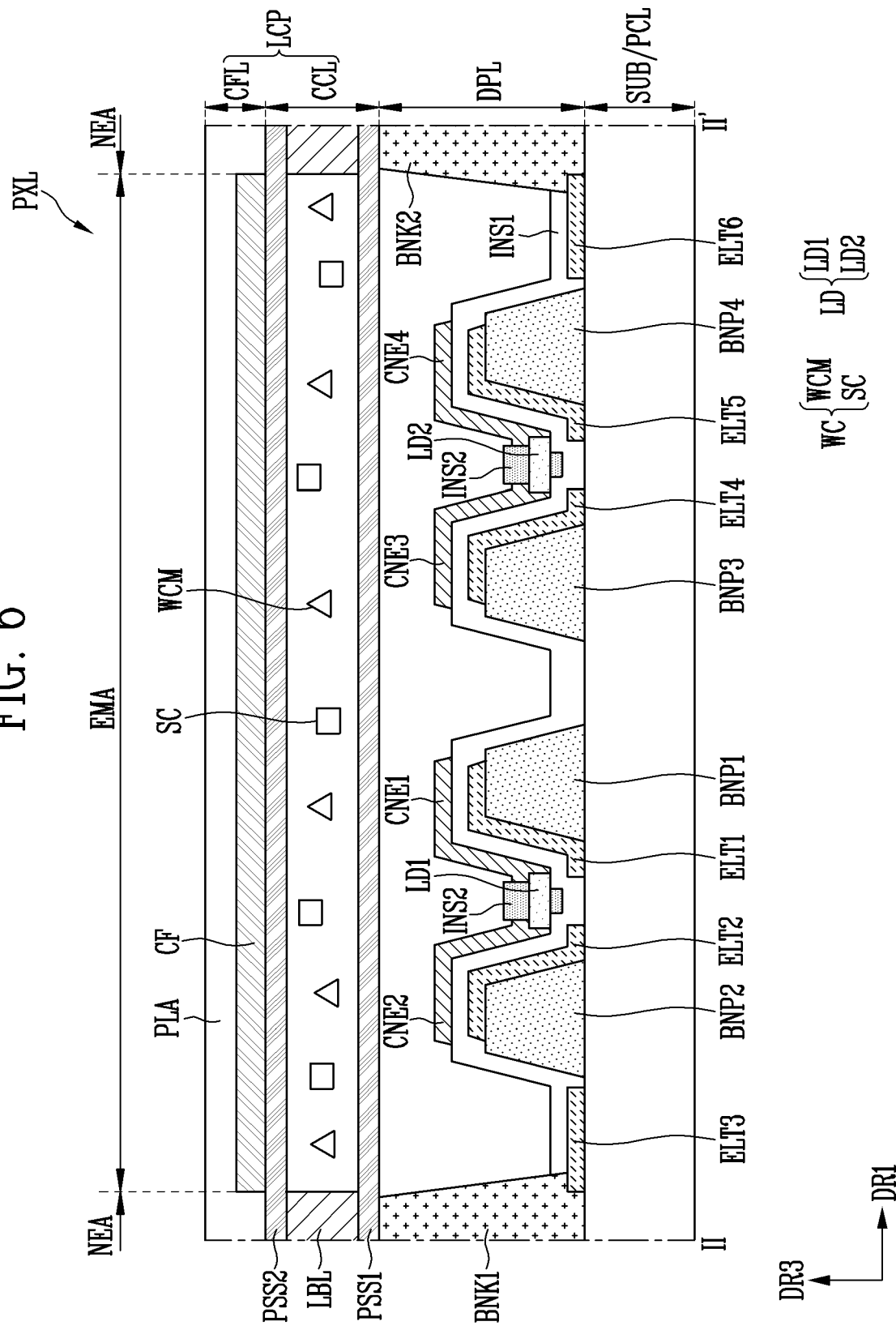
FIG. 6 is a cross-sectional view taken along the line II-II' of FIG. 4.

FIG. 6 is a cross-sectional view taken along the line II-II' of FIG. 4. FIG. 6 mainly illustrates the display element part DPL and a light control part LCP. The pixel PXL illustrated in FIG. 6 may be at least any one of the first to third pixels PXL1, PXL2, and PXL3.

Referring to FIG. 6, the display element part DPL may further include a first bank BNK1, a second bank BNK2, a third bank pattern BNP3, a fourth bank pattern BNP4, the third electrode ELT3, the fourth electrode ELT4, the fifth electrode ELT5, the sixth electrode ELT6, the second light emitting element LD2, the third contact electrode CNE3, and the fourth contact electrode CNE4.

The first bank BNK1 and the second bank BNK2 may be disposed on the passivation layer PSV. The first bank BNK1 and the second bank BNK2 may define an emission area EMA of the pixel PXL. For example, the emission area EMA may be defined as an area enclosed by the first bank BNK1 and the second bank BNK2.

In an embodiment, the emission area EMA may refer to an area from which light is emitted, and a non-emission area NEA may refer to an area from which light is not emitted.

The first bank BNK1 and the second bank BNK2 may protrude in the display direction (e.g., in a third direction DR3) of the display device DD. The first bank BNK1 and the second bank BNK2 may include an organic material and/or an inorganic material.

The first bank BNK1 may be disposed adjacent to the third electrode ELT3. In accordance with an embodiment, the first bank BNK1 may overlap the third electrode ELT3 in a plan view.

The second bank BNK2 may be disposed adjacent to the sixth electrode ELT6. In accordance with an embodiment, the second bank BNK2 may overlap the sixth electrode ELT6 in a plan view.

In an embodiment, the third electrode ELT3 and the sixth electrode ELT6 that are formed of floating lines may respectively overlap the first bank BNK1 and the second bank BNK2 such that a gap through which light emitted from the light emitting elements LD leaks toward the pixel circuit part PCL may be minimized or reduced. Hence, a light leakage phenomenon of the display device DD may be further reliably prevented or substantially prevented.

The third bank pattern BNP3 and the fourth bank pattern BNP4 may be disposed on the passivation layer PSV and have a shape protruding in the display direction of the display device DD.

The third electrode ELT3 may be disposed on the passivation layer PSV. The third electrode ELT3 may be disposed between the second bank pattern BNP2 and the first bank BNK1.

In accordance with an embodiment, the third electrode ELT3 may overlap the first bank BNK1 in a plan view.

The third electrode ELT3 may include any of the materials that are illustratively listed in the description of the first electrode ELT1 and the second electrode ELT2. In an embodiment, the third electrode ELT3 may include a reflective material.

The fourth electrode ELT4 and the fifth electrode ELT5 may be disposed on the passivation layer PSV. In an embodiment, at least a portion of the fourth electrode ELT4 may be disposed on the third bank pattern BNP3, and at least a portion of the fifth electrode ELT5 may be disposed on the fourth bank pattern BNP4, such that each may function as a reflective partition wall.

The sixth electrode ELT6 may be disposed on the passivation layer PSV. The sixth electrode ELT6 may be disposed between the fourth bank pattern BNP4 and the second bank BNK2.

In accordance with an embodiment, the sixth electrode ELT6 may overlap the second bank BNK2 in a plan view.

The sixth electrode ELT6 may include any of the materials that are illustratively listed in the description of the first electrode ELT1 and the second electrode ELT2. In an embodiment, the sixth electrode ELT6 may include a reflective material.

In accordance with an embodiment, the first to third electrodes ELT1 to ELT3 may be disposed on a same (e.g., identical) layer. In an embodiment, the first to third electrodes ELT1 to ELT3 may be formed (e.g., deposited) through a same (e.g., identical) process, and thus be disposed on the same (e.g., identical) layer. In an embodiment, the first to third electrodes ELT1 to ELT3 may have a same (e.g., identical) material.

In accordance with an embodiment, the fourth to sixth electrodes ELT4 to ELT6 may be disposed on a same (e.g., identical) layer. In an embodiment, the fourth to sixth electrodes ELT4 to ELT6 may be formed (e.g., deposited) through a same (e.g., identical) process, and thus be disposed on the same (e.g., identical) layer. In an embodiment, the fourth to sixth electrodes ELT4 to ELT6 may have a same (e.g., identical) material.

In accordance with an embodiment, the first to sixth electrodes ELT1 to ELT6 may be formed through a same (e.g., identical) process, and thus be disposed on a same (e.g., identical) layer. In an embodiment, the first to sixth electrodes ELT1 to ELT6 may be formed (e.g., deposited) through a same (e.g., identical) process, and include a same (e.g., identical) material.

In accordance with an embodiment, the third electrode ELT3 and the sixth electrode ELT6 may reflect light that travels toward the pixel circuit part PCL. For example, light that travels toward the pixel circuit part PCL may be light emitted from the light emitting elements LD and light applied from the display element part DPL to a color conversion part CCL, and include light reflected by a wavelength conversion material WCM. In other words, the third electrode ELT3 and the sixth electrode ELT6 may be formed on the passivation layer PSV such that light may be prevented or substantially prevented from moving from the display element part DPL to the pixel circuit part PCL, and a light leakage phenomenon of the display device DD may be prevented or substantially prevented.

The third contact electrode CNE3 and the fourth contact electrode CNE4 may be disposed on the first insulating layer INS1. The third contact electrode CNE3 may electrically connect the fourth electrode ELT4 with the second light emitting element LD2. The fourth contact electrode CNE4 may electrically connect the fifth electrode ELT5 with the second light emitting element LD2.

The third contact electrode CNE3 and the fourth contact electrode CNE4 may include any of the materials described in the description of the first contact electrode CNE1 and the second contact electrode CNE2.

The pixel PXL may further include the light control part LCP.

The light control part LCP may be disposed on the display element part DPL. In an embodiment, the light control part LCP may change a wavelength of light provided from the display element part DPL (or the light emitting elements LD). In accordance with an embodiment, the light control part LCP may include the color conversion part CCL and a color filter part CFL.

In accordance with an embodiment, the light emitting elements LD may emit light having a same (e.g., identical) color (e.g., blue), and the light control part LCP may be provided in the display device DD such that a full-color image may be displayed. However, the present disclosure is not limited thereto. In one or more embodiments, the light emitting elements LD may emit different colors of light.

The color conversion part CCL may be disposed on the display element part DPL. The color conversion part CCL may be disposed between the display element part DPL and the color filter part CFL.

However, a location of the color conversion part CCL is not limited to the foregoing example. For example, a wavelength converter WC may be disposed between the first bank BNK1 and the second bank BNK2, such that the display element part DPL and the color conversion part CCL may be disposed on a same (e.g., identical) layer.

In an embodiment, the color conversion part CCL may include a first passivation layer PSS1, the wavelength converter WC, a light blocking layer LBL, and a second passivation layer PSS2.

The first passivation layer PSS1 may be disposed between the display element part DPL and the light blocking layer LBL and between the display element part DPL and the wavelength converter WC. The first passivation layer PSS1 may seal (or cover) the wavelength converter WC. The first passivation layer PSS1 may include an inorganic material, and the material of the first passivation layer PSS1 is not limited to a specific example.

The wavelength converter WC may overlap the emission area EMA. The wavelength converter WC may be disposed in an area between light blocking layers LBL.

The wavelength converter WC may include the wavelength conversion material WCM and a scatterer SC. In an embodiment, the wavelength conversion material WCM may be dispersed and provided in a matrix material, such as a base resin.

In an embodiment, the wavelength conversion material WCM may be color conversion particles which convert light emitted from the light emitting elements LD to a color of light (e.g., a predetermined color of light). In an embodiment, the color conversion particles may be quantum dots configured to change the wavelength of light applied thereto. In an embodiment, the wavelength conversion material WCM may shift, according to energy transition, the wavelength of light applied thereto.

For example, in the first pixel PXL1, the wavelength conversion material WCM may include a first quantum dot capable of changing blue light to red light. In the second pixel PXL2, the wavelength conversion material WCM may include a second quantum dot capable of changing blue light to green light.

The wavelength conversion material WCM may have the form of a nanoparticle, a nanotube, a nanofiber, a planar nanoparticle, etc. having a spherical shape, a pyramid shape, a multi-arm shape, or a cubic shape, but the present disclosure is not limited thereto. The shape of the wavelength conversion material WCM may be changed in various ways.

In an embodiment, although not illustrated in the drawing, the wavelength converter WC in the third pixel PXL3 may not include the wavelength conversion material WCM. In this case, blue light provided from the display element part DPL may pass through the wavelength converter WC without a separate wavelength change.

The scatterer SC may be a composition provided to efficiently use light emitted from the light emitting element LD. In an embodiment, the scatterer SC may include silica or the like, but the present disclosure is not limited thereto.

The second passivation layer PSS2 may be disposed between the color filter part CFL and the light blocking layer LBL and between the color filter part CFL and the wavelength converter WC. The second passivation layer PSS2 may seal (or cover) the wavelength converter WC. The second passivation layer PSS2 may include an inorganic material, and the material of the second passivation layer PSS2 is not limited to a specific example.

The color filter part CFL may be disposed on the color conversion part CCL. In an embodiment, the color filter part CFL may include a color filter CF and a planarization layer PLA.

The color filter CF may overlap the emission area EMA of the pixel PXL in a plan view.

The color filter CF may allow a certain color (e.g., a predetermined color) of light to pass therethrough, and prevent or substantially prevent light having a color different from the certain color from passing therethrough.

In an embodiment, the color filter CF may include colorant pertaining to the certain color. For example, the color filter CF in the first pixel PXL1 may allow a first color of light to pass therethrough, and prevent or substantially prevent a second color of light and a third color of light from passing therethrough. The color filter CF in the second pixel PXL2 may allow a second color of light to pass therethrough, and prevent or substantially prevent a first color of light and a third color of light from passing therethrough. The color filter CF in the third pixel PXL3 may allow a third color of light to pass therethrough, and prevent or substantially prevent a first color of light and a second color of light from passing therethrough.

The planarization layer PLA may be disposed on the color filter CF. The planarization layer PLA may cover the color filter CF. The planarization layer PLA may remove a step difference caused by the color filter CF. In an embodiment, the planarization layer PLA may include an organic insulating material. However, the present disclosure is not limited thereto, and the planarization layer PLA may include an inorganic material.

However, the structure of the pixel PXL is not limited to the foregoing contents described with reference to FIG. 6. Various structures of the pixel PXL may be appropriately selected to provide the display device DD in accordance with an embodiment. For example, in embodiments, the display device DD may further include a low refractive layer configured to enhance the light efficiency.

Next, a pixel PXL in accordance with an embodiment will be described with reference to FIGS. 7 and 8. Descriptions which may be duplicated with that of the embodiments described above may be simplified or omitted.

Figure 7:
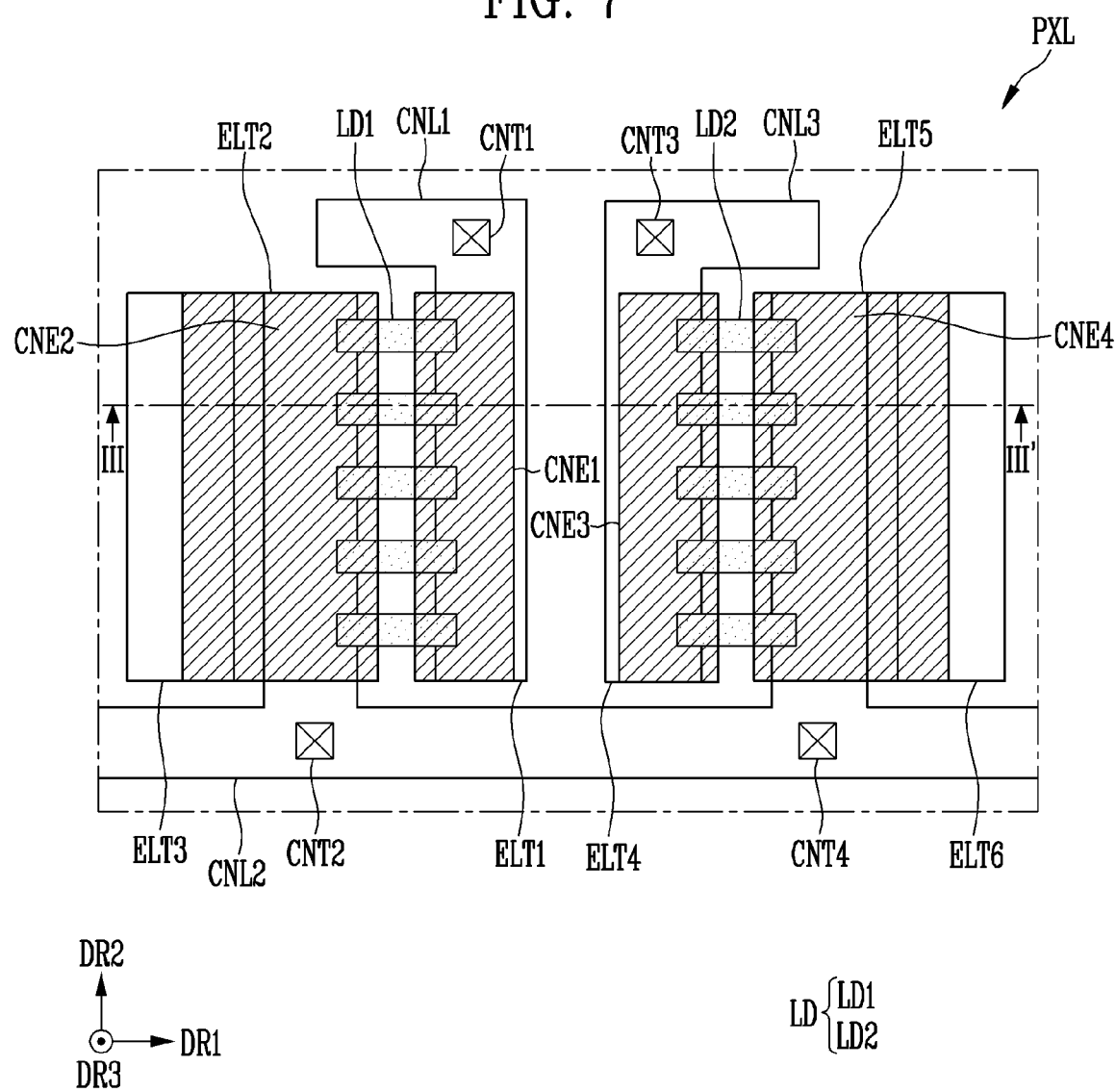
FIG. 7 is a plan view illustrating a pixel in accordance with an embodiment.
Figure 8:
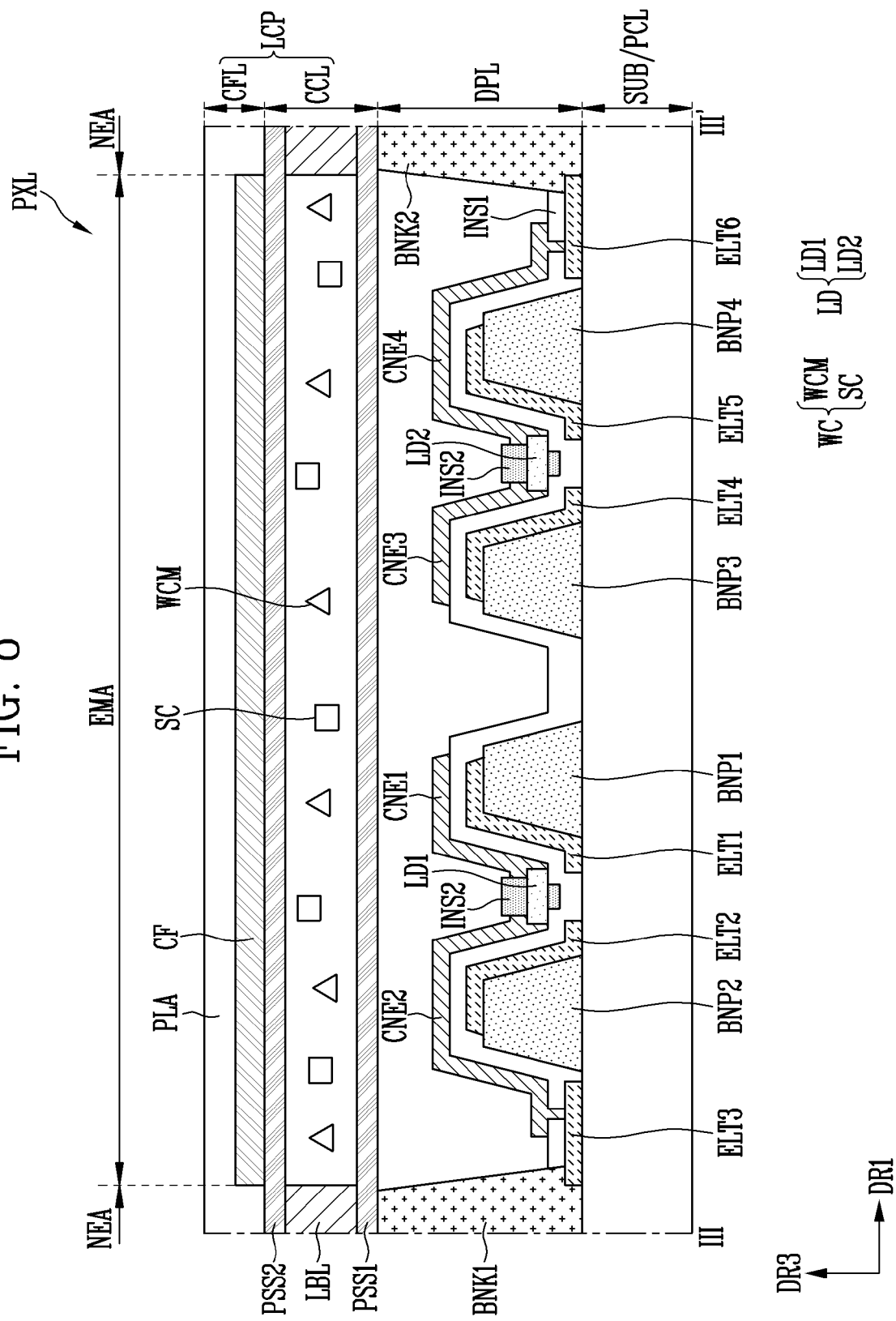
FIG. 8 is a cross-sectional view taken along the line III-III' of FIG. 7.

FIG. 7 is a plan view illustrating a pixel in accordance with an embodiment; and FIG. 8 is a cross-sectional view taken along the line III-III' of FIG. 7.

The pixel PXL in accordance with the present embodiment is different from the pixel PXL in accordance with the previous embodiment of FIGS. 4 to 6 in that the second contact electrode CNE2 is connected with the third electrode ELT3, and the fourth contact electrode CNE4 is connected with the sixth electrode ELT6.

In accordance with the present embodiment, the third electrode ELT3 and the sixth electrode ELT6 may be electrically connected with a line to which a cathode signal is to be provided. In an embodiment, the third electrode ELT3 and the sixth electrode ELT6 may be electrically connected with a ground line.

Referring to FIGS. 7 and 8, the second contact electrode CNE2 may be electrically connected with the third electrode ELT3, and the fourth contact electrode CNE4 may be electrically connected with the sixth electrode ELT6.

For example, the second contact electrode CNE2 may be electrically connected with the third electrode ELT3 through a contact hole formed in the first insulating layer INS1. The fourth contact electrode CNE4 may be electrically connected with the sixth electrode ELT6 through another contact hole formed in the first insulating layer INS1.

As a result, the third electrode ELT3 may be electrically connected with the second electrode ELT2 through the second contact electrode CNE2. The sixth electrode ELT6 may be electrically connected with the fifth electrode ELT5 through the fourth contact electrode CNE4.

In the present embodiment, in the same manner as the previous embodiment, the third electrode ELT3 may be electrically separated from the first electrode ELT1 and the second electrode ELT2 based on a time point at which the light emitting elements LD are arranged. Hence, the alignment of the light emitting elements LD may be improved, such that a light leakage phenomenon may be prevented or substantially prevented from occurring.

Herein, a method of fabricating a display device in accordance with an embodiment will be described with reference to FIGS. 9 to 18. Descriptions which may be duplicated with that of the embodiments described above may be simplified or omitted.

Figure 11:
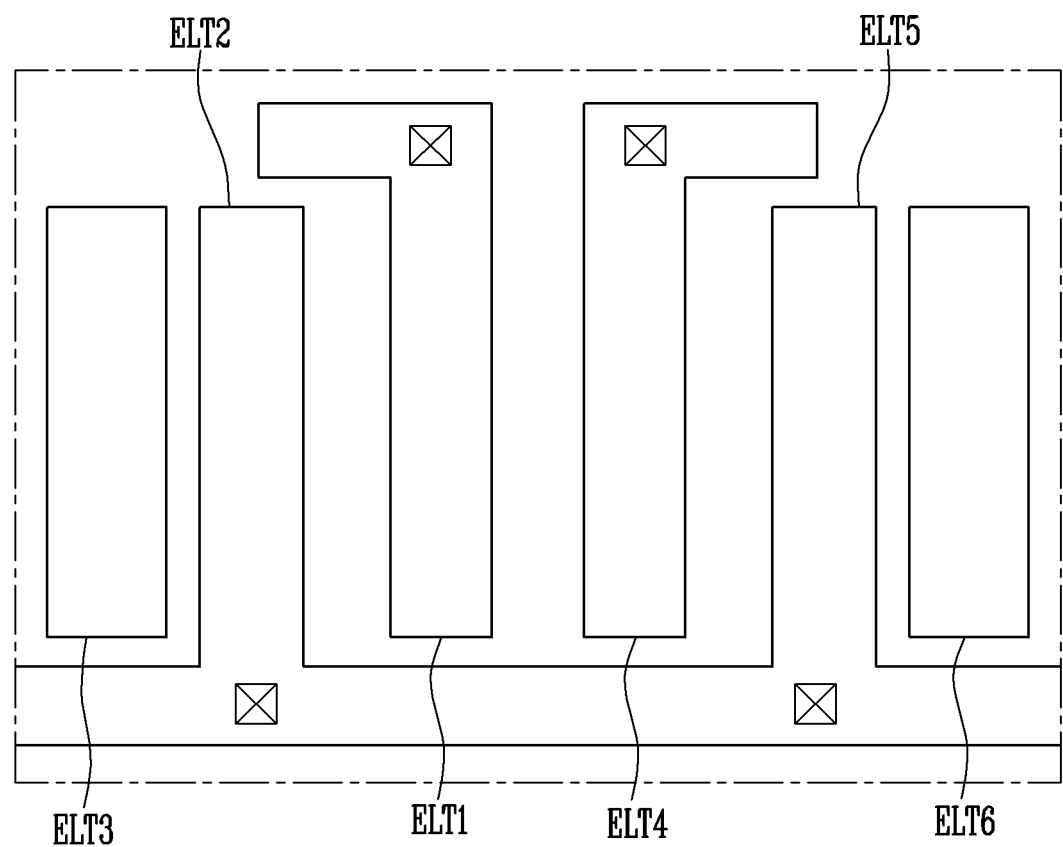
Figure 12:
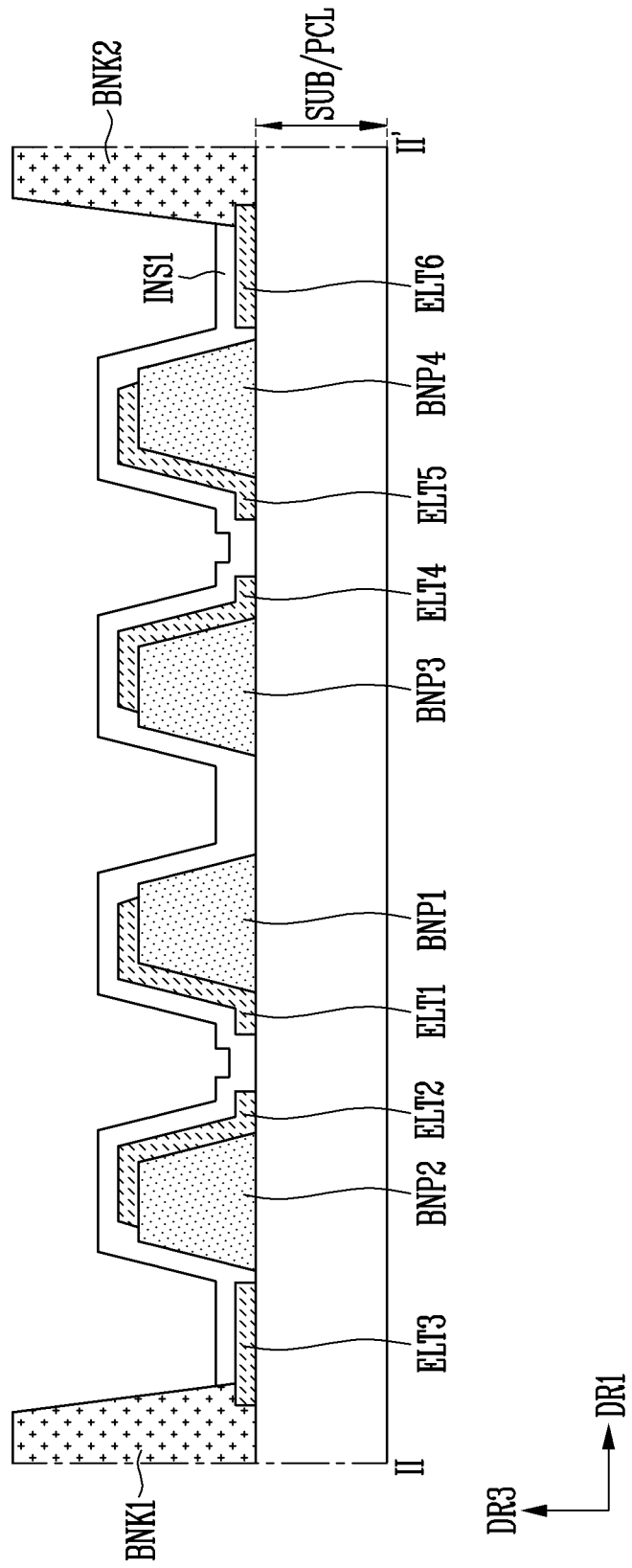
Figure 13:
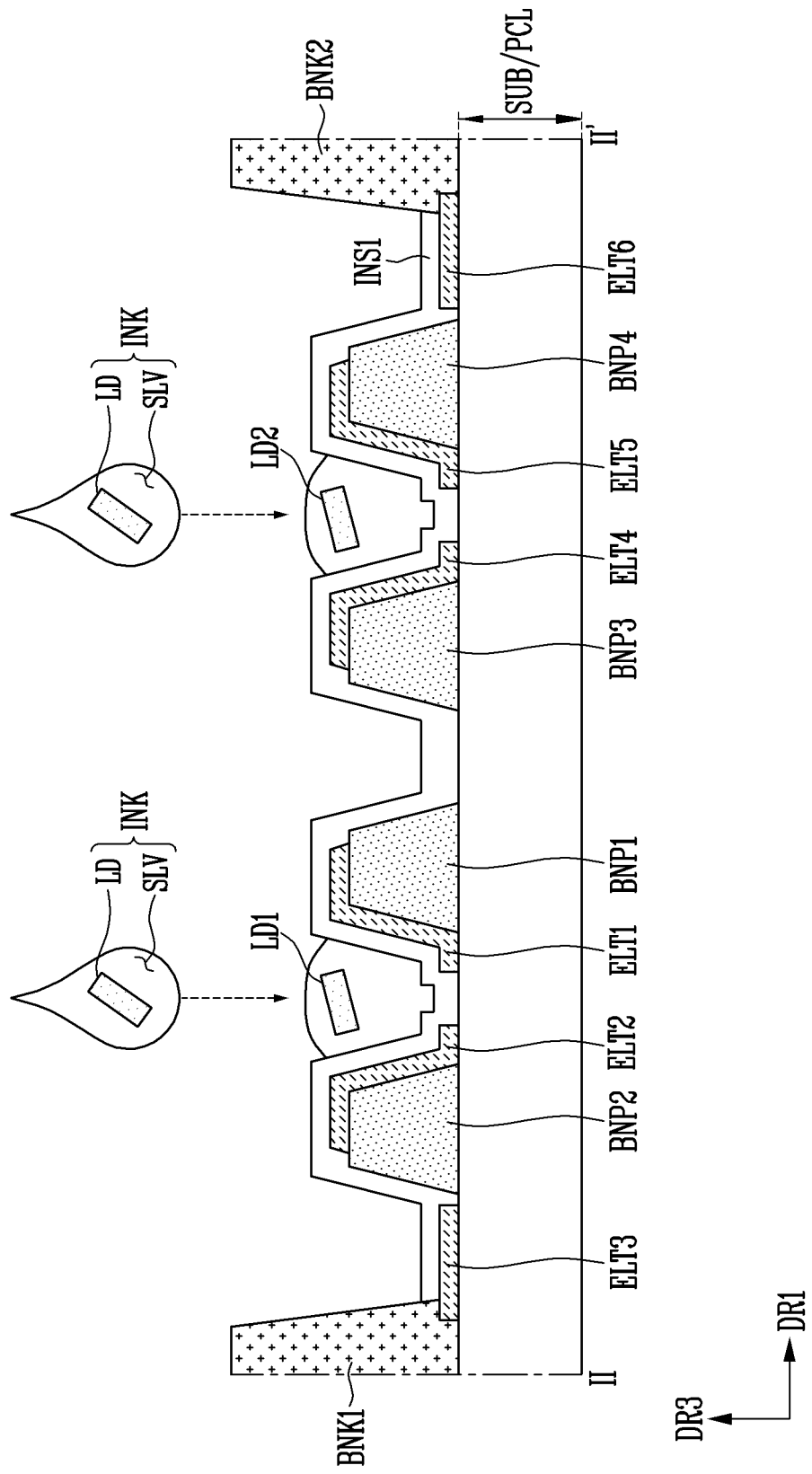
Figure 14:
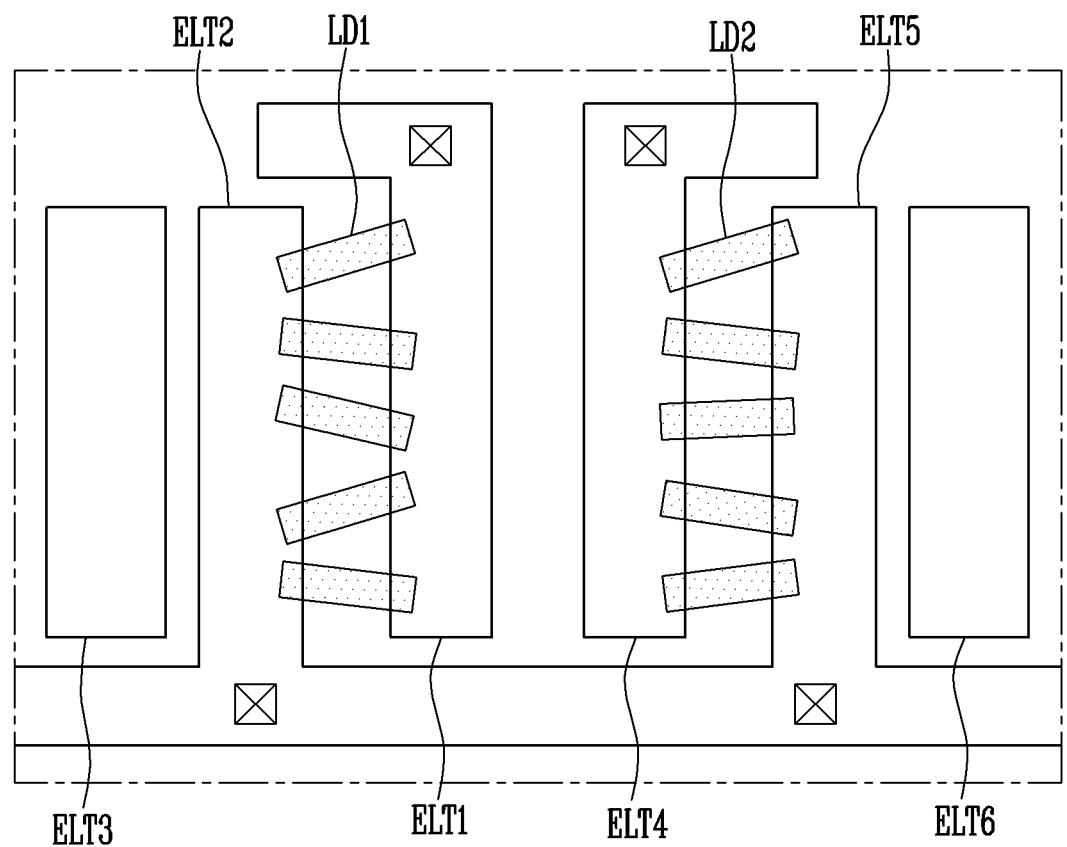
Figure 15:
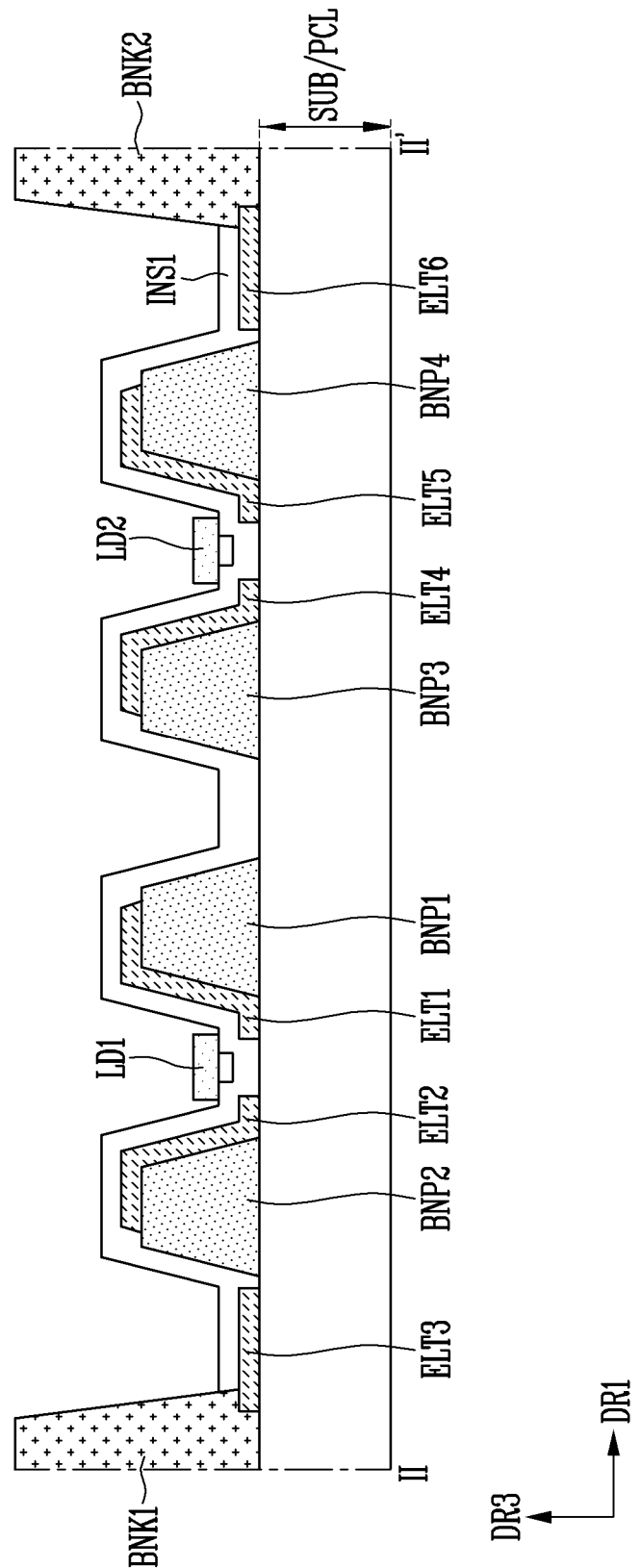
Figure 16:
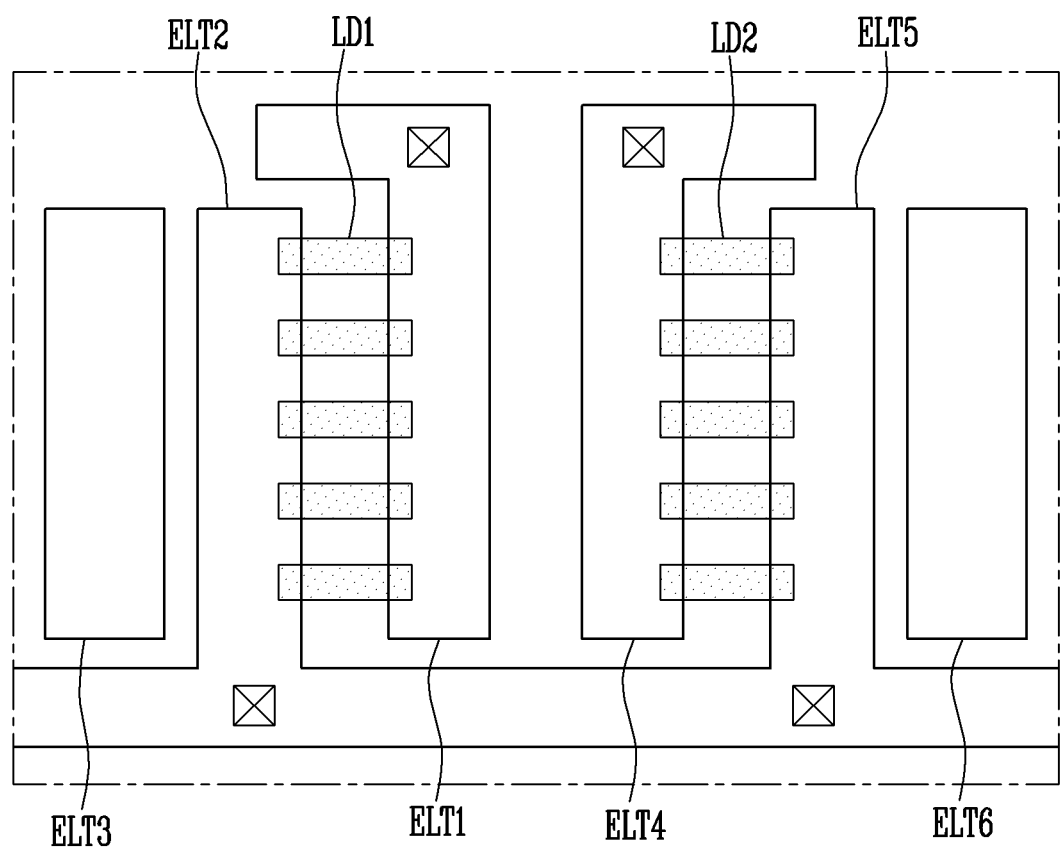
Figure 17:
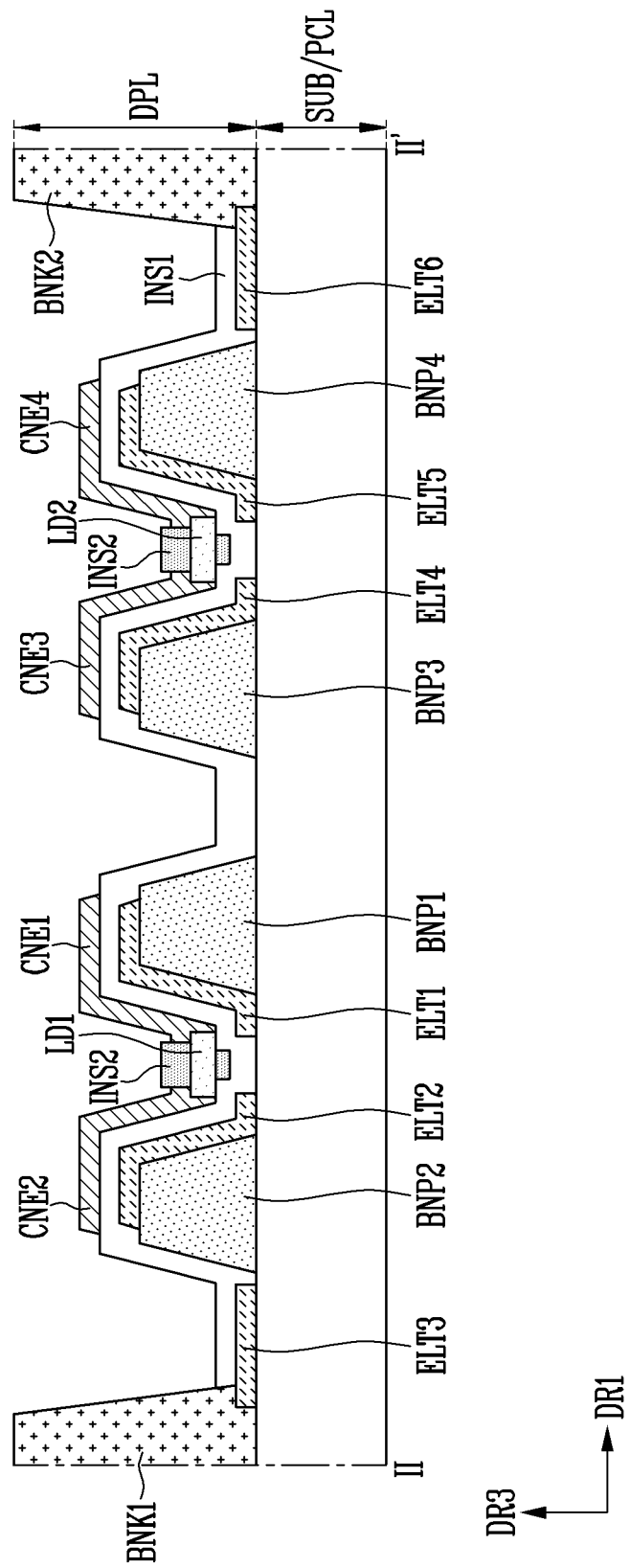
Figure 18:
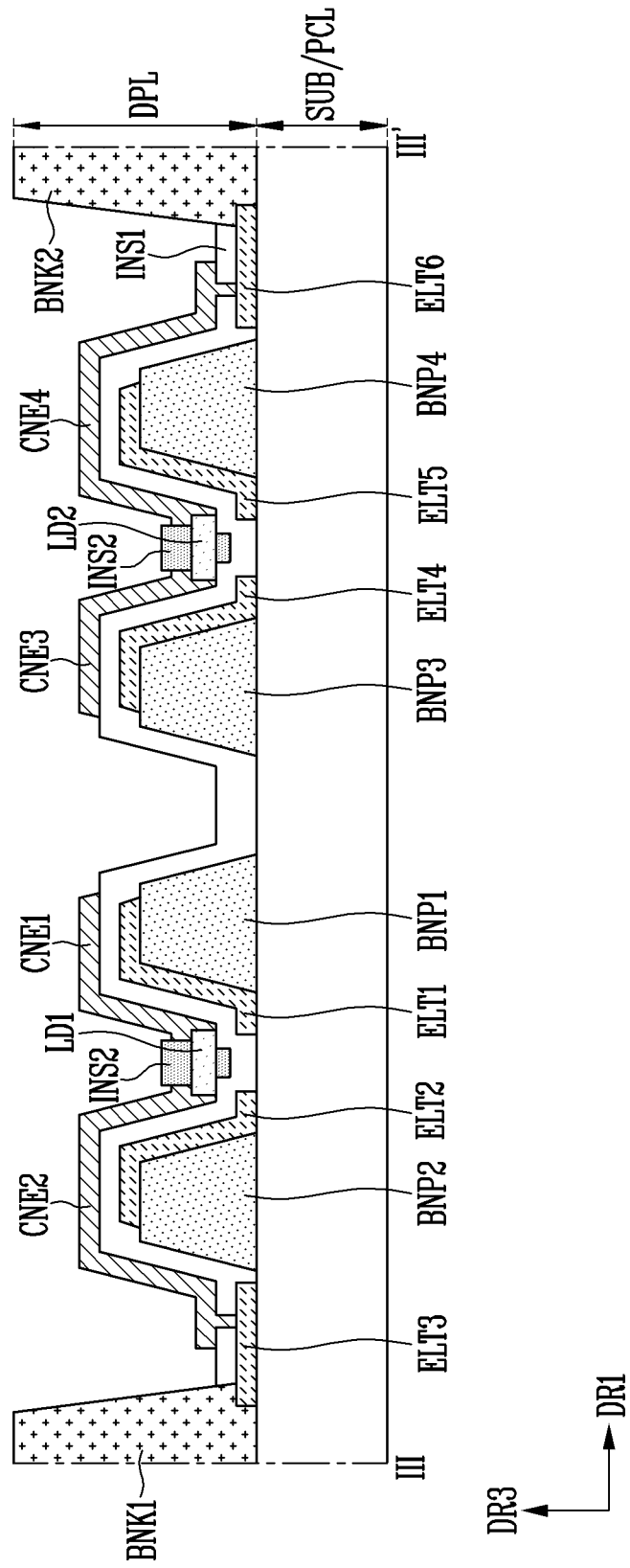

FIGS. 9 to 18 are views illustrating, by process steps, a method of fabricating a display device in accordance with an embodiment. More specifically, FIGS. 9, 10, 12, 13, 15, 17, and 18 are cross-sectional views illustrating, by process steps, a method of fabricating a display device in accordance with an embodiment. FIGS. 9, 10, 12, 13, 15, and 17 illustrate a method, based on cross-sectional structures taken along the line II-II' of FIG. 4. FIG. 18 illustrates a method, based on cross-sectional structures taken along the line III-III' of FIG. 7. FIGS. 11, 14, and 16 are plan views illustrating, by process steps, a method of fabricating a display device in accordance with an embodiment. FIGS. 11, 14, and 16 illustrate the method, based on the planar structure of FIG. 4.

Referring to FIG. 9, the substrate SUB may be provided (or prepared), and the pixel circuit part PCL may be provided (or disposed) on the substrate SUB. Thereafter, the first to fourth bank patterns BNP1 to BNP4 may be formed on the pixel circuit part PCL, and a base electrode BELT may be formed (or deposited) on the pixel circuit part PCL and the first to fourth bank patterns BNP1 to BNP4.

At the present stage, individual components of the pixel circuit part PCL disposed on the substrate SUB may be formed by patterning a conductive layer (or a metal layer), inorganic material, organic material, etc., through a typical process using a mask.

In an embodiment, at the present stage, the base electrode BELT may be deposited on an overall surface and cover at least each of the first to fourth bank patterns BNP1 to BNP4.

Referring to FIGS. 10 and 11, the first to sixth electrodes ELT1 to ELT6 spaced apart from each other may be provided by removing a portion of the base electrode BELT.

In an embodiment, at the present stage, a portion of the base electrode BELT may be etched such that at least a portion of each of the first to fourth bank patterns BNP1 to BNP4 may be exposed.

In an embodiment, at the present stage, the base electrode BELT may be etched such that the second electrode ELT2 and the third electrode ELT3 may be spaced apart from each other, and the fifth electrode ELT5 and the sixth electrode ELT6 may be spaced apart from each other.

In an embodiment, the third electrode ELT3 that is spaced apart from the first electrode ELT1 and the second electrode ELT2 may be provided as a floating line. The sixth electrode ELT6 that is spaced apart from the fourth electrode ELT4 and the fifth electrode ELT5 may be provided as a floating line.

At the present stage, at least a portion of the base electrode BELT may remain on the first to fourth bank patterns BNP1 to BNP4 and be provided as a reflective partition wall.

Referring to FIG. 12, the first bank BNK1 and the second bank BNK2 may be disposed (or formed), and the first insulating layer INS1 may be disposed (or formed).

In an embodiment, at the present stage, the first insulating layer INS1 may be deposited on an overall surface to cover the first to sixth electrodes ELT1 to ELT6.

In an embodiment, the disposing the first bank BNK1 and the second bank BNK2 may be performed after the first to sixth electrodes ELT1 to ELT6 are formed.

At the present stage, the first bank BNK1 and the second bank BNK2 may respectively overlap the third electrode ELT3 and the sixth electrode ELT6. Hence, an area which is not covered with the third electrode ELT3 or the sixth electrode ELT6 may be minimized or reduced, such that a light leakage phenomenon of the display device DD may be more reliably prevented or substantially prevented.

Referring to FIGS. 13 and 14, the ink INK including light emitting elements LD and a solvent SLV may be provided (e.g., sprayed) on the substrate SUB.

In an embodiment, the ink INK may be provided by a printing device capable of spraying liquefied fluid. In an embodiment, the printing device may include a nozzle configured to spray the liquefied fluid. The ink INK may refer to a liquefied mixture which may be output by the printed device.

In accordance with an embodiment, a plurality of light emitting elements LD may be dispersed (or provided) in the solvent SLV having fluidity. The solvent SLV may be fluid rather than having a solid phase, such that the light emitting elements LD may be dispersed therein.

At the present stage, at least some of the ink INK may be provided between the first electrode ELT1 and the second electrode ELT2 and between the fourth electrode ELT4 and the fifth electrode ELT5.

In an embodiment, at the present stage, an electric field is not formed between the first electrode ELT1 and the second electrode ELT2, such that first light emitting elements LD1 may be irregularly arranged, and an electric field is not formed between the fourth electrode ELT4 and the fifth electrode ELT5, such that second light emitting elements LD2 may be irregularly arranged.

Referring to FIGS. 15 and 16, an electric field may be formed between the first electrode ELT1 and the second electrode ELT2, and an electric field may be formed between the fourth electrode ELT4 and the fifth electrode ELT5.

At the present stage, alignment signals are applied to the first electrode ELT1 and the second electrode ELT2, such that an electric field may be formed between the first electrode ELT1 and the second electrode ELT2. For example, a first electrical signal may be provided to the first electrode ELT1, and a second electrical signal may be provided to the second electrode ELT2, such that an electric field based on the first electrical signal and the second electrical signal may be formed between the first electrode ELT1 and the second electrode ELT2.

Therefore, the first light emitting elements LD1 may be aligned between the first electrode ELT1 and the second electrode ELT2. In other words, at least some of the light emitting elements LD included in the ink INK may be arranged between the first electrode ELT1 and the second electrode ELT2.

In an embodiment, an AC signal may be applied to the first electrode ELT1 and the second electrode ELT2. In an embodiment, the AC signal may be any of a sine wave, a triangular wave, a step wave, a trapezoidal wave, and a pulse wave, but the present disclosure is not limited thereto. The AC signal may have any of various known AC signal forms.

Likewise, at the present stage, alignment signals may be applied to the fourth electrode ELT4 and the fifth electrode ELT5, such that an electric field may be formed between the fourth electrode ELT4 and the fifth electrode ELT5. For example, a third electrical signal may be provided to the fourth electrode ELT4, and a fourth electrical signal may be provided to the fifth electrode ELT5, such that an electric field based on the third electrical signal and the fourth electrical signal may be formed between the fourth electrode ELT4 and the fifth electrode ELT5.

Therefore, the second light emitting elements LD2 may be aligned between the fourth electrode ELT4 and the fifth electrode ELT5. In other words, at least some other of the light emitting elements LD included in the ink INK may be arranged between the fourth electrode ELT4 and the fifth electrode ELT5.

Here, the alignment signals (e.g., the first electrical signal and the second electrical signal) that are provided to the first electrode ELT1 and the second electrode ELT2 may not be provided to the third electrode ELT3. The alignment signals (e.g., the third electrical signal and the fourth electrical signal) that are provided to the fourth electrode ELT4 and the fifth electrode ELT5 may not be provided to the sixth electrode ELT6.

Subsequently, the solvent SLV included in the ink INK that is provided on the substrate SUB may be removed through a separate process.

Referring to FIG. 17, the second insulating layer INS2 may be formed (or provided), and the first to fourth contact electrodes CNE1 to CNE4 may be formed (or provided), such that the display element part DPL may be provided.

At the present stage, the second insulating layer INS2 may be deposited to cover at least a portion of each of the first light emitting elements LD1 and the second light emitting elements LD2.

At the present stage, the second insulating layer INS2 may be disposed on a surface of each of the first light emitting elements LD1 and the second light emitting elements LD2. In an embodiment, the second insulating layer INS2 may be charged into the groove formed at the rear surfaces of the first light emitting elements LD1 and the second light emitting elements LD2.

At the present stage, the first to fourth contact electrodes CNE1 to CNE4 may be deposited. In an embodiment, the first to fourth contact electrodes CNE1 to CNE4 may be provided by patterning through a same (e.g., an identical) process. However, the present disclosure is not limited thereto. In an embodiment, the second contact electrode CNE2 and the fourth contact electrode CNE4 may be formed after the first contact electrode CNE1 and the third contact electrode CNE3 are formed.

In an embodiment, after the present stage, the first contact electrode CNE1 may electrically connect the first electrode ELT1 with the first light emitting element LD1, and the second contact electrode CNE2 may electrically connect the second electrode ELT2 with the first light emitting element LD1. Likewise, the third contact electrode CNE3 may electrically connect the fourth electrode ELT4 with the second light emitting element LD2. The fourth contact electrode CNE4 may electrically connect the fifth electrode ELT5 with the second light emitting element LD2.

Thereafter, although not shown in the drawings, the light control part LCP may be disposed on the display element part DPL, such that the display device DD in accordance with an embodiment may be provided.

Referring to FIG. 18, the second contact electrode CNE2 may be connected with the third electrode ELT3, and the fourth contact electrode CNE4 may be connected with the sixth electrode ELT6, whereby the display DD in accordance with an embodiment (see FIGS. 7 and 8) may be provided.

In accordance with an embodiment, to connect the second contact electrode CNE2 with the third electrode ELT3 and connect the fourth contact electrode CNE4 with the sixth electrode ELT6, holes that respectively overlap the third electrode ELT3 and the sixth electrode ELT6 in a plan view may be formed in the first insulating layer INS1. After the overlapping holes are formed, the first to fourth contact electrodes CNE1 to CNE4 are formed (or provided). Thus, the second contact electrode CNE2 may be connected with the third electrode ELT3, and the fourth contact electrode CNE4 may be connected with the sixth electrode ELT6.

As the present stage is performed, the third electrode ELT3 may be electrically connected with the second contact electrode CNE2, and the sixth electrode ELT6 may be electrically connected with the fourth contact electrode CNE4. For example, a cathode signal (or a ground signal) to be provided to the first light emitting element LD1 may be provided to the second contact electrode CNE2, such that the third electrode ELT3 may not be provided as a floating line. Likewise, a cathode signal (or a ground signal) to be provided to the second light emitting element LD2 may be provided to the fourth contact electrode CNE4, such that the sixth electrode ELT6 may not be provided as a floating line.

Various embodiments of the present disclosure may provide a display device and a method of fabricating a display device in which alignment of light emitting elements is excellent, and a light leakage phenomenon is mitigated.

However, effects of the present disclosure may not be limited to the above, and other effects of the present disclosure will be clearly understandable to those having ordinary skill in the art from the disclosures provided together with the accompanying drawings.

Although some embodiments of the present disclosure have been described for illustrative purposes, those skilled in the art will appreciate that various modifications, additions, and substitutions are possible, without departing from the scope and spirit of the disclosure. Therefore, the above-described embodiments of the present disclosure may be implemented separately or in combination.

Accordingly, the embodiments disclosed herein are intended not to limit but to describe the technical spirit of the present disclosure, and the scope of the present disclosure is not limited to the embodiments. The scope of the present disclosure should be construed by the appended claims, and the technical spirit within the scope of their equivalents should be construed as being included in the scope of the present disclosure.

What is claimed is:

1. A display device comprising:
   a first electrode and a second electrode on a substrate and spaced apart from each other;
   a bank on the substrate, and protruding in a display direction of the display device;
   a third electrode on the substrate; and
   a first light emitting element between the first electrode and the second electrode,
   wherein the first electrode, the second electrode, and the third electrode are arranged on a same layer,
   wherein the third electrode is electrically separated from the first electrode and the second electrode, and
   wherein the bank and the third electrode overlap each other only partially in plan view.

2. The display device according to claim 1, wherein, in a plan view, the third electrode overlaps neither the first electrode nor the second electrode.

3. The display device according to claim 2, wherein the first electrode and the second electrode are spaced apart from each other in a first direction, and
wherein the third electrode is spaced apart from the first electrode and the second electrode in the first direction, and extends in a second direction intersecting the first direction.

4. The display device according to claim 1, wherein the first electrode, the second electrode, and the third electrode comprise a same material.

5. The display device according to claim 1, wherein the third electrode comprises a reflective material, such that light provided to the third electrode is reflected in the display direction of the display device.

6. The display device according to claim 1, further comprising:
a first contact electrode electrically connecting the first electrode with the first light emitting element; and
a second contact electrode electrically connecting the second electrode with the first light emitting element,
wherein the first contact electrode and the second contact electrode are electrically separated from the third electrode.

7. The display device according to claim 1, further comprising:
a fourth electrode and a fifth electrode on the substrate and spaced apart from each other;
a second light emitting element between the fourth electrode and the fifth electrode; and
a sixth electrode on the substrate and overlapping neither the fourth electrode nor the fifth electrode in a plan view.

8. The display device according to claim 7, wherein the first electrode, the second electrode, the third electrode, the fourth electrode, the fifth electrode, and the sixth electrode comprise a same material.

9. The display device according to claim 7, further comprising:
a third contact electrode electrically connecting the fourth electrode with the second light emitting element; and
a fourth contact electrode electrically connecting the fifth electrode with the second light emitting element,
wherein the third contact electrode and the fourth contact electrode are electrically separated from the sixth electrode.

10. The display device according to claim 1, wherein the third electrode is a floating line.

11. The display device according to claim 1, wherein a portion of the third electrode is between the second electrode and the bank.

12. The display device according to claim 1, further comprising a light control part configured to change a wavelength of light provided from the first light emitting element.

13. A display device comprising:
a first electrode and a second electrode on a substrate and spaced apart from each other;
a third electrode on the substrate;
a light emitting element between the first electrode and the second electrode;
a first contact electrode electrically connecting the first electrode with the light emitting element; and
a second contact electrode electrically connecting the second electrode with the light emitting element,
wherein the first electrode, the second electrode, and the third electrode are arranged on a same layer,
wherein, in a plan view, the third electrode overlaps neither the first electrode nor the second electrode, and
wherein the second contact electrode is electrically connected with the third electrode.

14. The display device according to claim 13, wherein the light emitting element is supplied with a cathode signal through the second electrode and the second contact electrode.

* * * * *